(12) United States Patent
Zhou et al.

(10) Patent No.: US 6,340,942 B1
(45) Date of Patent: Jan. 22, 2002

(54) ANALOG TO DIGITAL CONVERTER

(75) Inventors: Changming Zhou; Kunihiko Suzuki; Takashi Tomatsu; Masataka Fukui, all of Tokyo (JP)

(73) Assignee: Yozan Inc., Tokyo (JP)

(*) Notice: Subject to any disclaimer, the term of this patent is extended or adjusted under 35 U.S.C. 154(b) by 0 days.

(21) Appl. No.: 09/413,475

(22) Filed: Oct. 6, 1999

(30) Foreign Application Priority Data

Oct. 7, 1998 (JP) .......................................... 10-285175
Oct. 13, 1998 (JP) .......................................... 10-289901

(51) Int. Cl.[7] ............................................... H03M 1/34
(52) U.S. Cl. ...................................... 341/158; 341/156
(58) Field of Search ................................. 341/118, 120, 341/143, 155, 61, 200

(56) References Cited

U.S. PATENT DOCUMENTS 5,696,512 A * 12/1997 Takiguchi .................. 341/144
5,748,131 A * 5/1998 Motohashi et al. ......... 341/155
5,893,049 A * 4/1999 Reggiardo ................... 702/71
5,894,282 A * 4/1999 Betts et al. ................. 341/157

* cited by examiner

Primary Examiner—Peguy JeanPierre
Assistant Examiner—Joseph Lauture
(74) Attorney, Agent, or Firm—Pillsbury Winthrop LLP

(57) ABSTRACT

An analog to digital converter comprises a differential input portion that receives an input voltage and a reference voltage and has a first and second output terminals, a positive feedback portion connected to said first and second output terminals, a buffer if CMOSFETs connected at its input to the first output terminal, a second buffer connected at its input to the second output terminal, and a comparison circuit including a first switching portion connected between the first and second output terminals for connecting and disconnecting the first and second output terminals in response to a comparison clock signal. The comparison circuit is connected at its output to the first or second buffer. The input voltage and the reference voltage are compared when said switching portion changes from the connecting condition to the disconnecting condition in response to the comparison clock signal.

14 Claims, 20 Drawing Sheets

Fig.6

| Analog Input Voltage | Output Voltage | | | | Output | | | |
|---|---|---|---|---|---|---|---|---|
| Vin | Vd0 | Vd1 | Vd2 | Vd3 | d0 | d1 | d2 | d3 |
| Vdd−LV1≦Vin< A0 | 0 | 0 | 0 | 0 | 0 | 0 | 0 | 0 |
| A0 ≦ Vin < A1 | Vdd | 0 | 0 | 0 | 1 | 0 | 0 | 0 |
| A1 ≦ Vin < A2 | 0 | Vdd | 0 | 0 | 0 | 1 | 0 | 0 |
| A2 ≦ Vin < A3 | Vdd | Vdd | 0 | 0 | 1 | 1 | 0 | 0 |
| A3 ≦ Vin < A4 | 0 | 0 | Vdd | 0 | 0 | 0 | 1 | 0 |
| A4 ≦ Vin < A5 | Vdd | 0 | Vdd | 0 | 1 | 0 | 1 | 0 |
| A5 ≦ Vin < A6 | 0 | Vdd | Vdd | 0 | 0 | 1 | 1 | 0 |
| A6 ≦ Vin < A7 | Vdd | Vdd | Vdd | 0 | 1 | 1 | 1 | 0 |
| A7 ≦ Vin < A8 | 0 | 0 | 0 | Vdd | 0 | 0 | 0 | 1 |
| A8 ≦ Vin < A9 | Vdd | 0 | 0 | Vdd | 1 | 0 | 0 | 1 |
| A9 ≦ Vin < A10 | 0 | Vdd | 0 | Vdd | 0 | 1 | 0 | 1 |
| A10≦ Vin < A11 | Vdd | Vdd | 0 | Vdd | 1 | 1 | 0 | 1 |
| A11 ≦ Vin < A12 | 0 | 0 | Vdd | Vdd | 0 | 0 | 1 | 1 |
| A12 ≦ Vin < A13 | Vdd | 0 | Vdd | Vdd | 1 | 0 | 1 | 1 |
| A13 ≦ Vin < A14 | 0 | Vdd | Vdd | Vdd | 0 | 1 | 1 | 1 |
| A14 ≦Vin<Vdd−VL2 | Vdd | Vdd | Vdd | Vdd | 1 | 1 | 1 | 1 |

Fig.8

| $d_3$ ($V_{d3}$) | $d_2$ ($V_{d2}$) | $d_1$ ($V_{d1}$) | $d_0$ ($V_{d0}$) | $V_{th}$ |
|---|---|---|---|---|
| 0 ( 0 ) | 0 ( 0 ) | 0 ( 0 ) | 0 ( 0 ) | $16V_{ref}/8$ |
| 0 ( 0 ) | 0 ( 0 ) | 0 ( 0 ) | 1 ($2V_{ref}$) | $15V_{ref}/8$ |
| 0 ( 0 ) | 0 ( 0 ) | 1 ($2V_{ref}$) | 0 ( 0 ) | $14V_{ref}/8$ |
| 0 ( 0 ) | 0 ( 0 ) | 1 ($2V_{ref}$) | 1 ($2V_{ref}$) | $13V_{ref}/8$ |
| 0 ( 0 ) | 1 ($2V_{ref}$) | 0 ( 0 ) | 0 ( 0 ) | $12V_{ref}/8$ |
| 0 ( 0 ) | 1 ($2V_{ref}$) | 0 ( 0 ) | 1 ($2V_{ref}$) | $11V_{ref}/8$ |
| 0 ( 0 ) | 1 ($2V_{ref}$) | 1 ($2V_{ref}$) | 0 ( 0 ) | $10V_{ref}/8$ |
| 0 ( 0 ) | 1 ($2V_{ref}$) | 1 ($2V_{ref}$) | 1 ($2V_{ref}$) | $9V_{ref}/8$ |
| 1 ($2V_{ref}$) | 0 ( 0 ) | 0 ( 0 ) | 0 ( 0 ) | $8V_{ref}/8$ |
| 1 ($2V_{ref}$) | 0 ( 0 ) | 0 ( 0 ) | 1 ($2V_{ref}$) | $7V_{ref}/8$ |
| 1 ($2V_{ref}$) | 0 ( 0 ) | 1 ($2V_{ref}$) | 0 ( 0 ) | $6V_{ref}/8$ |
| 1 ($2V_{ref}$) | 0 ( 0 ) | 1 ($2V_{ref}$) | 1 ($2V_{ref}$) | $5V_{ref}/8$ |
| 1 ($2V_{ref}$) | 1 ($2V_{ref}$) | 0 ( 0 ) | 0 ( 0 ) | $4V_{ref}/8$ |
| 1 ($2V_{ref}$) | 1 ($2V_{ref}$) | 0 ( 0 ) | 1 ($2V_{ref}$) | $3V_{ref}/8$ |
| 1 ($2V_{ref}$) | 1 ($2V_{ref}$) | 1 ($2V_{ref}$) | 0 ( 0 ) | $2V_{ref}/8$ |
| 1 ($2V_{ref}$) | 1 ($2V_{ref}$) | 1 ($2V_{ref}$) | 1 ($2V_{ref}$) | $V_{ref}/8$ |

ANALOG TO DIGITAL CONVERTER

DETAILED DESCRIPTION OF THE INVENTION

BACKGROUND OF THE INVENTION

1. Field of the Invention

The present invention relates to an analog to digital converter.

2. Prior Art

The inventors of the present invention proposed a voltage-driven analog to digital (A/D) converter of low electrical power consumption used in a handy terminal for a digital mobile communication, in Japanese Patent Publication Hei09-083364. This A/D converter includes a plurality of comparators consisting of a complementary metal-oxide-semiconductor (CMOS) inverter and a plurality of threshold setting circuits consisting of capacitive couplings connected to inputs of the comparators. Analog input voltages are input to the threshold setting circuits, and outputs of the comparators are weighted by predetermined weights and are input to threshold setting circuits of lower bits. A high accuracy and low power consumption are realized.

However, the conventional A/D converter defines the thresholds of the comparators by logical thresholds of the CMOS inverters, therefore, the outputs of the A/D converter is unstable when the input voltage is nearly equal to the threshold. And the threshold has a deviation due to manufacturing conditions.

Besides the above A/D converter, a sequential A/D converter is well-known, which includes a comparator for comparing an input voltage with a threshold voltage. Then one bit of a digital data is generated and the bit is converted into an analog data to be fed back to the comparator. This process is repeated for generating the total bits of a digital data, therefore, it takes a log time.

SUMMARY OF THE INVENTION

The present invention has an object to provide a stable A/D converter of high speed, being free from deviation depending on manufacturing condition.

An A/D converter according to the present invention

BRIEF DESCRIPTION OF THE DRAWINGS

FIG. 6 is a table showing a relationship between input and output of the comparison circuit in FIG. 2;

FIG. 8 is a table showing a substantial thresholds of the comparison circuit in FIG. 7;

PREFERRED EMBODIMENTS

Hereinafter, preferred embodiments of matched filter circuits according to the present invention are described with reference to the attached drawings.

Figure 1:
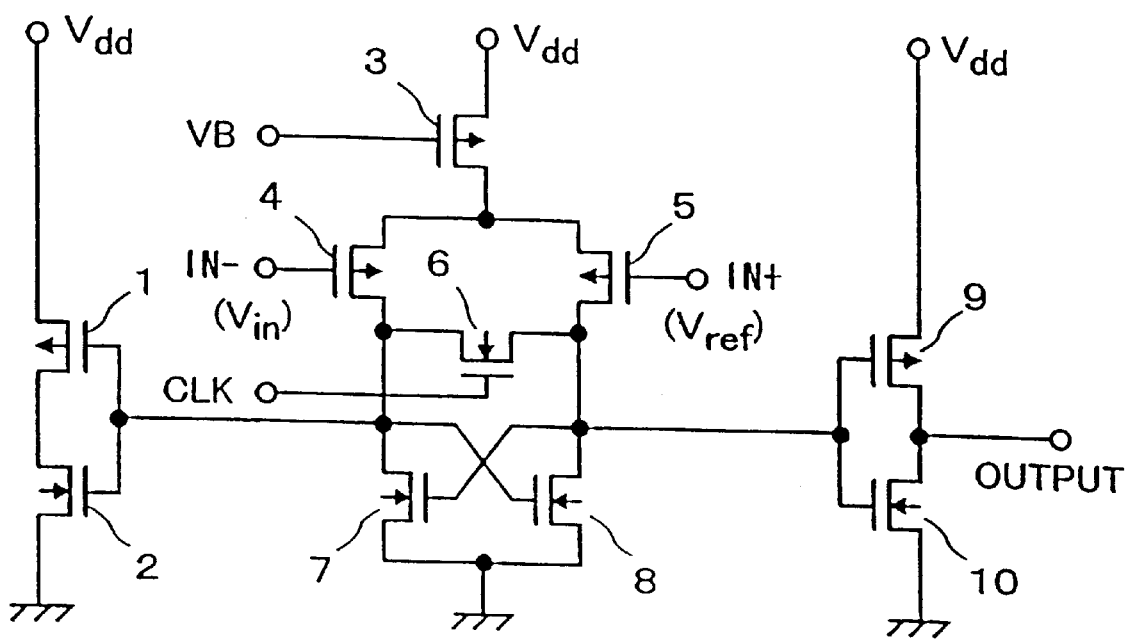
FIG. 1 is a circuit diagram showing a comparison circuit used in a first embodiment of an A/D converter according to the present invention.

FIG. 1 is a circuit diagram showing a comparison circuit used in a first embodiment of an A/D converter according to the present invention. In FIGS. 1, 1, 3, 4, 5, 9 are PMOS-FETs and 2, 6, 7, 8, 10 are NMOSFETs.

In a central portion, a supply voltage Vdd is commonly input through the PMOSFET 3 to source terminals of the PMOSFETs 4 and 5. Drains terminals of the PMOSFETs 4 and 5 are connected to drain terminals of the NMOSFETs 7 and 8. Source terminals of the NMOSFETs 7 and 6 are commonly to a ground. A gate terminal of the NMOSFET 7 is connected to the drain terminal of the NMOSFET 8, and a gate terminal of the NMOSFET 8 is connected to the drain terminal of NMOSFET 8, thus crossing connection is provided. The NMOSFET 6 is connected between the drain terminals of the PMOSFETs 4 and 5. A comparison clock is input to a gate terminal of the NMOSFET 6. The drain terminal of the PMOSFET 4 is connected to a gate terminal of a CMOS inverter consisting of the PMOSFET 1 and NMOSFET 2 at a left side. The drain terminal of the PMOSFET 5 is connected to a gate terminal of a CMOS inverter consisting of the PMOSFET 9 and the NMOSFET 10 at a right side. The supply voltage Vdd and the ground voltage "0" are connected to these CMOSs.

The PMOSFET 3 is a constant current control circuit, connected at a gate terminal with a bias voltage. The current is changed by adjusting the bias voltage. A working speed of the PMOSFET 3 becomes higher when the current increases. The consumed current and the working speed are adjusted in response to a usage. A gate terminal of the PMOSFET 4 is used as IN− terminal receiving an input voltage Vin, while a gate terminal of the PMOSFET 5 is used as IN+ terminal receiving the reference voltage Vref from a reference voltage generator outside. Typically, the reference voltage Vref is Vdd/2. The NMOSFETs 7 and 8 are a positive feedback circuit. The NMOSFET 6 is controlled by a comparison clock CLK to be a waiting status or a comparison status. The NMOSFET 6 may be substituted by a PM.

A CMOS consisting of the PMOSFET 9 and NMOSFET 10 is a buffer stage for a wave-shaping, having an output terminal OUTPUT. A CMOS inverter consisting of the PMOSFET 1 and the NMOSFET 2 has no output, but preserves horizontal symmetrization of the comparison circuit.

The comparison circuit is of an inverting output type for outputting an inversion of the IN− at the terminal OUTPUT. A non-inverting output type may be applied, in which an output is provide in the CMOS inverter consisting of the PMOSFET 1 and NMOSFET 2, or the voltages Vin and Vref are input to IN+ and IN−, respectively.

Next, a performance of the comparison circuit is described. When the clock supplied to the gate of the NMOSFET 6 is high level, the drain and the source terminals are short-circuited and comparison circuit becomes waiting mode. If the comparison circuit were a completely symmetric, the outputs of the CMOS inverters becomes intermediate voltage and the current is kept flowing. It increases the current consumption. In order to solve this problem, the circuit elements are designed for slightly disturbing the symmetrization. For example, it is designed that the PMOSFET 5 outputs a low level signal and the terminal OUTPUT outputs a high level signal.

When the clock signal input to a gate of the NMOSFET 6 is changed to low level, the NMOSFET 6 opens and the comparison is started of the input voltage Vin of the gate terminal of the PMOSFET 4 and the reference voltage Vref at the gate terminal of the PMOSFET 5.

Outputs of the PMOSFETs 4 and 5 becomes floating. When the Vin is a little higher than the Vref, the output of the PMOSFET becomes high level quickly due to the positive feedback between the NMOSFET 7 and 8 in response to the voltage difference between Vin and Vref. Then, the OUTPUT becomes low level. When the Vin is a little lower than the Vref, the comparison circuit returns to waiting mode, and the OUTPUT is kept low level. The PMOSFET 1 and the NMOSFET 2 at the left side are symmetric to the PMOSFET 9 and the NMOSFET 10 at the right side, thus a sensitivity of the comparison circuit is high.

It is necessary to make the comparison circuit the waiting mode before the comparison, however, it is advantageous that the comparison circuit has high sensitivity and a high comparison speed. Since the output steeply changes in response to a small input change, the output signal is stable even when the input signal is around the threshold. The level determination is performed according to the difference between two inputs, thus it is not influenced by a manufacturing deviation. The symmetric circuit is advantageous in the output accuracy, thus the comparison circuit of high accuracy is easily obtained by appropriate layout pattern in an integrated circuit.

Figure 2:
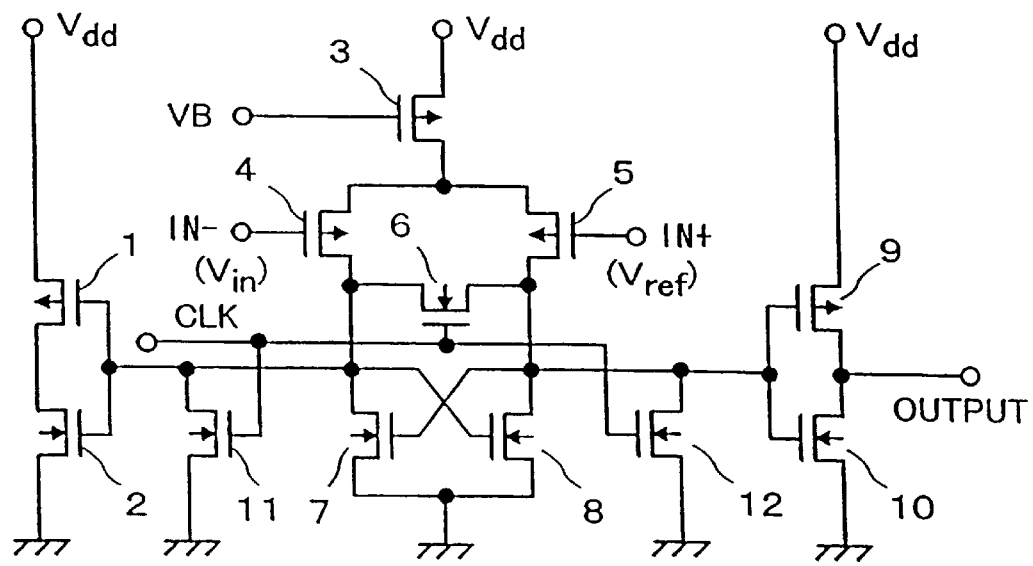
FIG. 2 is a circuit diagram showing another comparison circuit.

FIG. 2 is a circuit diagram showing another comparison circuit. In FIG. 2, similar components to those in FIG. 1 are designated by the same references. Differently from FIG. 1, there are disposed NMOSFETs 11 and 12.

As mentioned above, if the comparison circuit were completely symmetric, the outputs of the CMOS inverters becomes intermediate voltage and the current is kept flowing in the waiting mode. The electrical power consumption increases.

In FIG. 2, the NMOSFET 11 and 12 are symmetrically connected between the drain terminals of the NMOSFETs 7 and 8 and the ground, respectively. The clock CLK is input to gate terminals of the NMOSFETs 11 and 12. The clock CLK is kept high during waiting mode, the drain terminals of the NMOSFETs 11 and 12 are compulsorily low. The CMOS inverters at both sides are high level, thus the electrical power consumption is a little. NMOSFET 11 and 12 may be substituted by PMOSFETs, together with NMOSFET 6. In this case the clock CLK is inverted. Since, in this embodiment, the electrical power is low due to the circuit construction itself independently from the circuit design, the circuit design is rather flexible.

Figure 3:
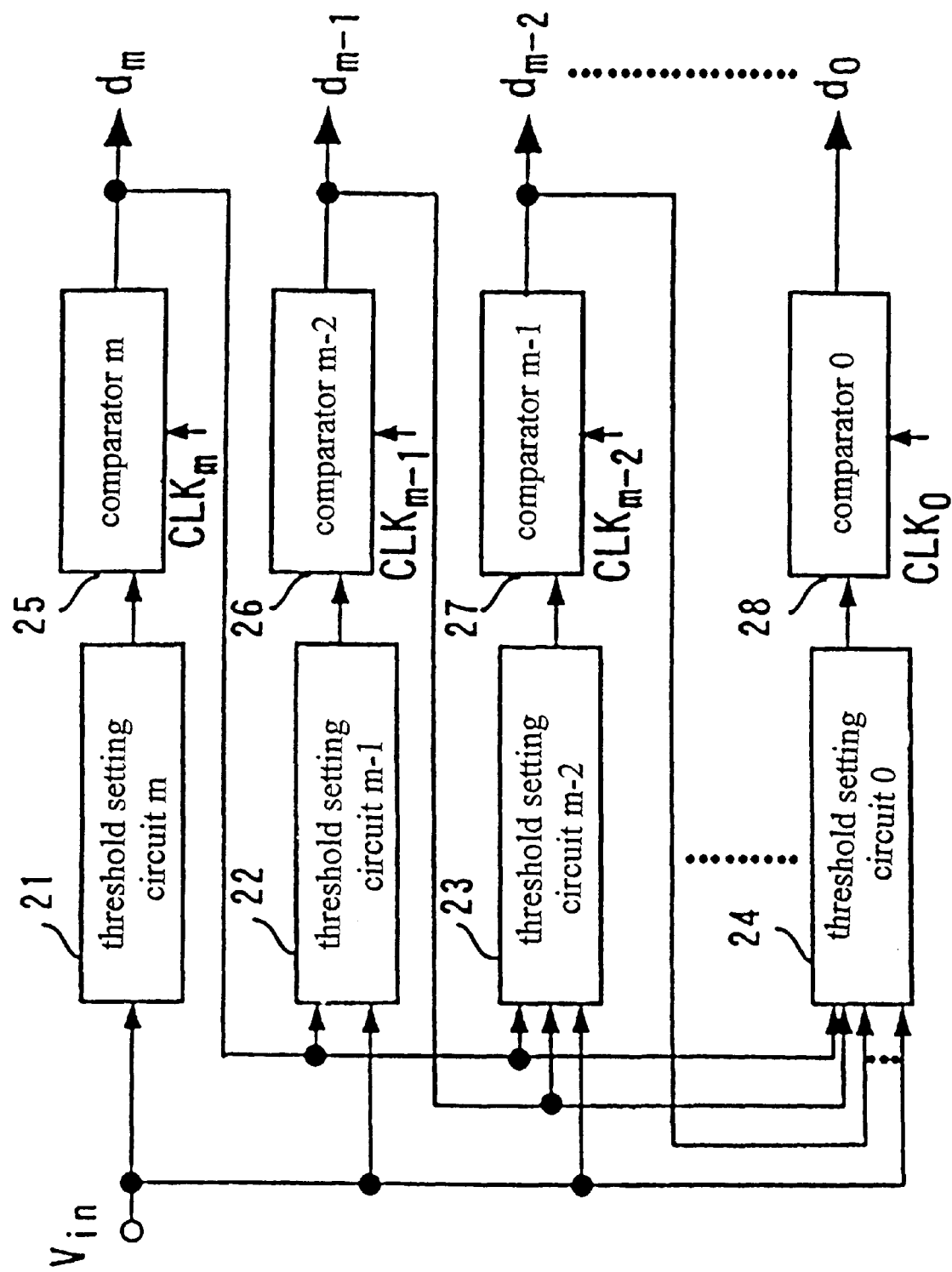
FIG. 3 is a block diagram showing the first embodiment of the A/D converter according to the present invention.

FIG. 3 is a block diagram showing the first embodiment of the A/D converter according to the present invention. In FIGS. 3, 21 to 24 are threshold setting circuits, and 25 to 28 are comparison circuits. This A/D converter converts the input voltage Vin into (m+1) bits digital value. Since, the input voltage Vin must be kept constant until one time A/D conversion is completed (for one sampled input voltage), the input voltage Vin is sampled and held, or kept substantially unchanged.

Figure 4:
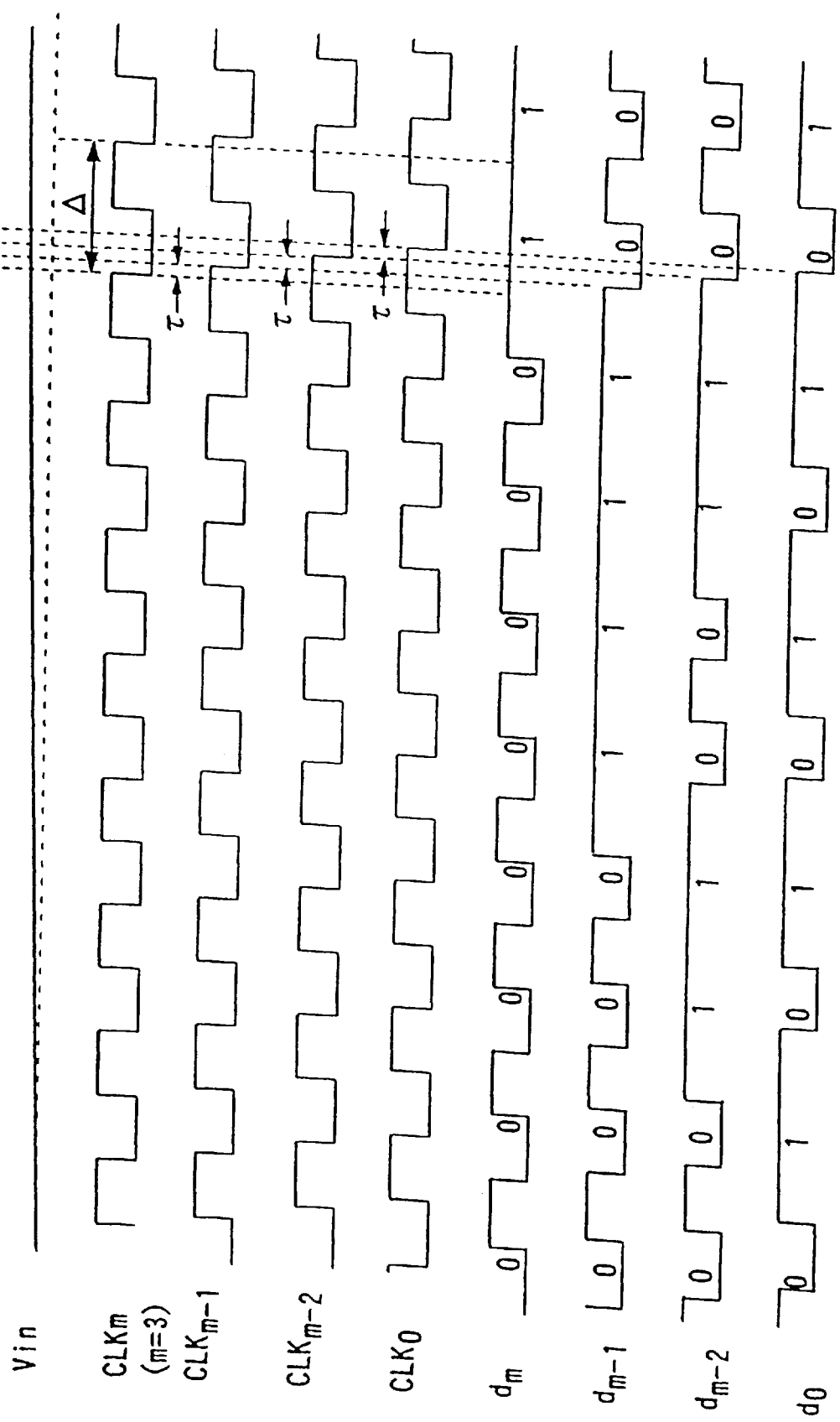
FIG. 4 is a timing chart showing clocks supplied to comparison circuits in FIG. 3.

FIG. 4 is a timing chart showing clocks supplied to comparison circuits 25 to 28 in FIG. 3. In FIG. 4, m=3 and m+1=4, the input voltage Vin linearly and gradually increases from the ground voltage "0".

In FIG. 3, threshold setting circuits 21 to 24 are disposed corresponding to the (m+1)th bit to the first bit after the A/D conversion prior to the comparison circuits 25 to 28. The analog input voltage Vin is parallelly input to the threshold setting circuits 21 to 24. The outputs of the comparison circuits 25 to 27 are input to the threshold setting circuits 22 to 24 of lower bits with weighted by weights corresponding to weight differences of bits. The comparison circuits 25 to 28 are non-inverted type receiving the outputs of the threshold setting circuits 21 to 24.

In FIG. 4, the comparison circuit 25 to 28 perform comparison in response to leading edge of clocks CLKm to CLK0 (duty ratio 50%) of a period Δ successively delayed by a time τ, and successively output digital outputs dm to d0 corresponding to the analog input voltage Vin. When the comparison is completed, the comparison result is held, and at the next leading edge of the clocks CLKm to CLK0, the waiting mode is started again. These processes are repeated. In the waiting mode, the outputs dm to d0 of the comparison circuits 25 to 28 are kept constant, high level in this embodiment regardless to the input voltage. The threshold setting circuits do not set the threshold for the input voltage.

Next, the performance of holding the comparison result is described according to FIG. 3. The threshold of the comparison circuits 25 to 28 is fixed to Vref as mentioned with reference to FIG. 1. The threshold setting circuit 21 outputs the input voltage Vin shifted by predetermined offset when Vin exceeds a substantial threshold defined by the weight $2^m$ of the MSB such that the comparison circuit changes high level. Similarly, the threshold setting circuits 22 to 24 output the input voltage Vin shifted by predetermined offsets when Vin exceeds a substantial thresholds defined by the weights of corresponding bits such that the comparison circuits 26 to 28 changes high level.

The substantial threshold corresponds to an approximation value of the input voltage using the bits of the thresholding setting circuits 22 to 24 and upper bits. The threshold setting circuits 21 to 24 may be a circuit using serial resistances for giving level shift in the input voltage Vin. The above circuits using the capacitances consume much less electrical power, however some set-up time is necessary due to inner resistance of the capacitances.

The threshold setting circuit 21 to 24 have different circuitry constructions, thus the set-up times for the bits are different from one another. The set-up time depends also on the input voltage Vin.

Since, the timings of the waiting mode are successively shifted by τ for the comparison circuits 25 to 28, the outputs dm to d0 are valid in a period between the leading edge of the CLKo and the trailing edge of the CLKm after the completion of the comparison.

The comparison outputs of the comparison circuits 25 to 28 are directly input to the threshold setting circuits 22 to 24, however, it is also possible to dispose flip-flops for holding the outputs of the comparison circuits 25 to 28 and to output the latched data to the threshold setting circuits 22 to 24.

In the above embodiment, the reference voltage is constant and the analog input voltage is shifted for changing the substantial threshold, it is also possible to change the reference voltages for each of the comparison circuits. Each of the comparison circuits receives the analog input voltage and the corresponding reference voltage.

Figure 5:
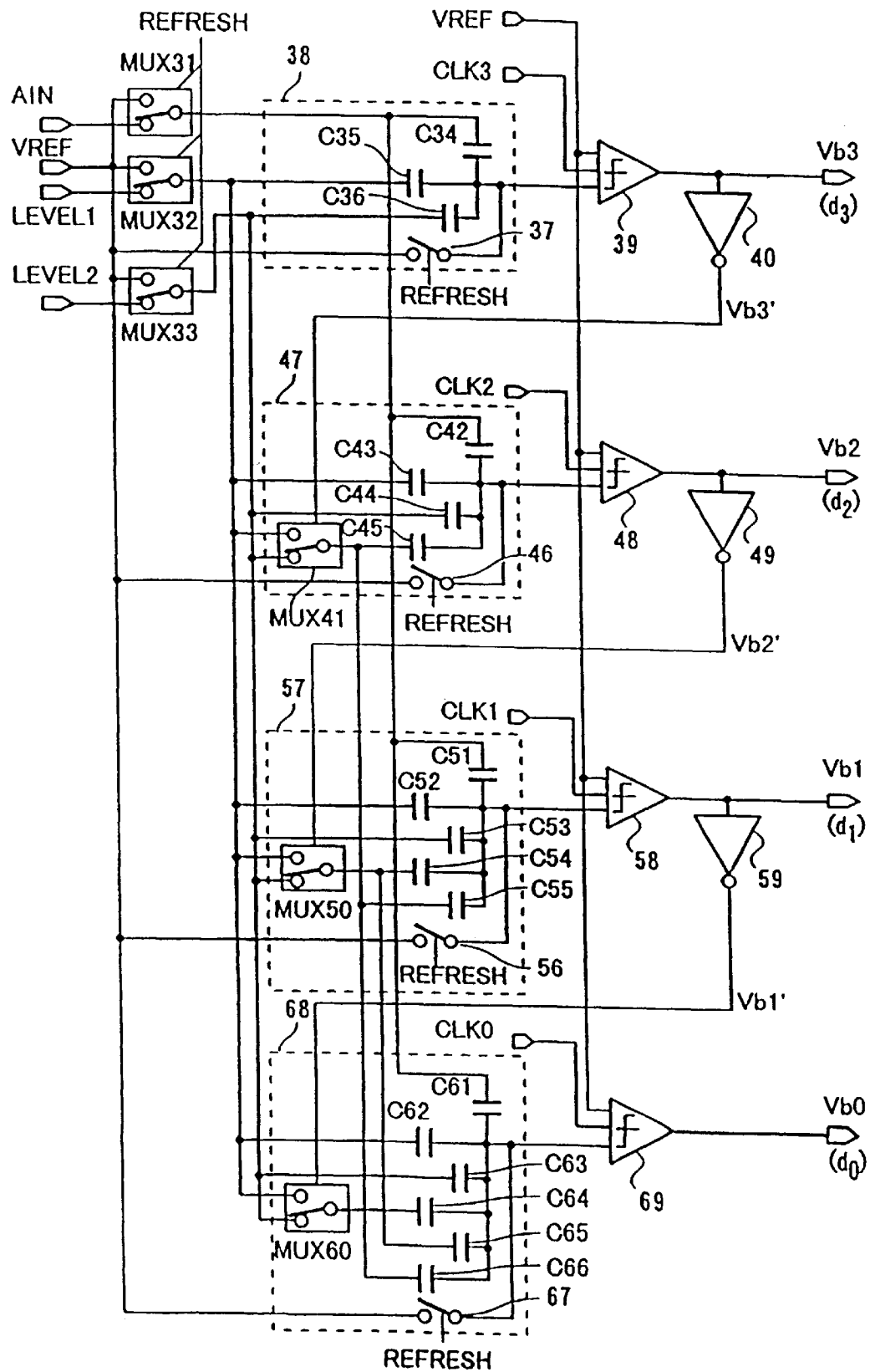
FIG. 5 is a block diagram showing a second embodiment of the A/D converter according to the present invention.

FIG. 5 is a block diagram showing a second embodiment of the A/D converter according to the present invention. In FIG. 5, 31 to 33, 41, 50 and 69 are multiplexers, 34 to 36, 42 to 45, 51 to 55 and 61 to 66 are input capacitances, 37, 46, 56 and 67 are switches, 38, 47, 57 and 68 are threshold setting circuits, 39, 48, 58 and 69 are comparison circuits, and 40, 49, 59 and 69 are inverters.

This A/D converter is a voltage driven type similar to the circuits in Japanese Patent Publication Hei09-083364, and additionally includes means for setting from outside an upper and lower limits of A/D conversion such that the input voltage between the upper and lower limits is converted into a digital data and a high resolution is obtained.

In this embodiment, the comparison circuits 39, 48, 58 and 69 are non-inverted comparison circuits based on the comparison circuits in FIGS. 1 and 2. The conversion performance is similar to that in the first embodiment in FIGS. 3 and 4. At the leading edge of the comparison clocks CLK3 to CLK0 successively shifted by τ, the comparison is performed and the digital outputs d3 to d0 are successively output. After the comparison, the comparison results are held. At the next leading edge of CLK3 to CLK0, the waiting mode starts and all of the d3 to d0 become "1". In the following description, the waiting mode is omitted for ease in understanding.

Usually, a voltage between the supply voltage Vdd and the ground voltage "0" is converted into a digital data. The upper and lower limits of the input voltage is not adjustable from the outside. A resolution of the conversion becomes lower as a full scale of the input voltage is narrower than the difference between Vdd and "0".

Outer input terminals are provided, AIN for inputting Vin, LEVEL1 for inputting a first level voltage LV1, LEVEL2 for inputting a second level voltage LV2, and VREF for inputting the reference voltage Vref for the comparison circuits 39, 48, 58 and 69. Vref is Vdd/2.

The first level voltage LV1 corresponding to the lower limit of the analog input voltage Vin and the second level voltage LV2 corresponding to the upper limit of the analog input voltage Vin are input to the LEVEL1 and LEVEL2, respectively. When the full range of Vin is "0" to Vdd similar to the above, LV1=Vdd and LV2=0.

When the expressions are transferred according to a change in the reference not of the ground voltage but of Vref=Vdd/2. The analog input voltage is (Vin−Vdd/2), the lower limit is (Vdd/2−LV1) and its inversion is (LV1−Vdd/2), the upper limit is (Vdd/2−LV2) and its inversion is (LV2−Vdd/2), and the inversions are input from the terminals LEVEL1 and LEVEL2, respectively.

It is also possible that the comparison circuits 39, 48, 58 and 69 are driven by two supply voltages of positive and negative with zero basis of Vref. A first level voltage (LV1) of an inversion of the lower limit (−LV1) of the analog input voltage Vin is input from the terminal LEVEL1. A second level voltage (LV2) of an inversion of the upper limit (−LV2) of the analog input voltage Vin is input from the terminal LEVEL2.

The multiplexers 31 to 33 are controlled by a refresh signal REFRESH such that they output Vref when refreshing, and output Vin, LV1 or LV2 when normal working, to the input terminals of the capacitances C34 to C37, C42 to C45, C51 to C55, C61 to C66 in the thresholding circuits 38, 47, 57 and 68. The thresholding circuits 38, 47, 57 and 68 are similar to the thresholding circuits 21 to 24 in FIG. 3. The comparison circuits 39, 48, 58 and 69 correspond to the comparison circuits 25 to 28 in FIG. 3, using the comparison circuits in FIGS. 1 and 2 as non-inverting type comparison circuits. Digital circuits d3 to d0 of the comparison circuits 39, 48, 58 and 69 correspond to dm to d0 in FIG. 4.

The threshold setting circuits 38, 47, 57 and 68 are connected at their output side with one terminals of switches 37, 46, 56 and 67, respectively. The other terminals are connected to the VREF. When the refresh signal REFRESH is high level, the switches 37, 46, 56 and 67 are closed.

Other threshold setting circuits 47, 57 and 68 than the MSB (the third bit) receive outputs of the comparison circuits 39, 48, 58 of the upper bits through inverters 40, 49, 59 as control signals of the corresponding multiplexers 41, 50 and 60. A comparison outputs of the upper bits are not directly input to the threshold setting circuits 47, 57 and 68, but through multiplexers 41, 50 and 60 such that the fixed level voltages LV1 and LV2 are supplied to the threshold setting circuits 57 and 68.

During the normal working mode when the refresh signal REFRESH is low level, the multiplexer MUX41 outputs LV1 or LV2 to the lower threshold setting circuits 57 and 68 in response to an output Vb3' of the MSB inverter 40. When Vb3 is "0" (low level) and the output Vb3' of the inverter 40 is Vdd (high level), the multiplexer 41 outputs the LV1 to the input capacitances C45, C55 and C66. While, when Vb3 is Vdd (high level) and the output Vb3' of the inverter 40 is "0" (low level), the multiplexer 41 outputs the LV2 to the input capacitances C45, C55 and C66.

Similarly, the multiplexer MUX50 outputs LV1 or LV2 through the inverter 49 to the lower threshold setting circuits 57 and 68 in response to the output of the second bit comparison circuit 48. The multiplexer MUX60 outputs LV1 or LV2 through the inverter 59 to the lower threshold setting circuit 68 in response to the output of the first bit comparison circuit 58. The inverters 40, 49 and 59 are used as buffers. These buffers may be omitted by inverting the relationship between the inputs and the output of the multiplexers 41, 50 and 60.

Hereinafter, a performance of the A/D converter above is described.

A relationship between capacities of the input capacitances C34 to C36, C42 to C45, C51 to C55, C61 to C66 is as follows.

$$C34:C35:C36=16:8:8$$

C42:C43:C44:C45=16:4:4:8

C51:C52:C53:C54:C55=16:2:2:4:8

C61:C62:C63:C64:C65:C66=16:1:1:2:4:8

In the third bit threshold setting circuit 38, the capacitances C35 and C36 corresponding to LV1 and LV2, respectively, have the capacity of 8 (=$2^3$), and the capacitance C36 corresponding to Vin has the capacity of 16 (=$2^4$)

In the second bit threshold setting circuit 47, the capacitances C43 and C44 corresponding to LV1 and LV2, respectively, have the capacity of 4(=$2^2$), the capacitance C45 corresponding to the output of one bit upper comparison circuit 39 has a capacity of 8(=$2^3$), and the capacitance C42 corresponding to Vin has the capacity of 16(=$2^4$).

In the first bit threshold setting circuit 57, the capacitances C52 and C53 corresponding to LV1 and LV2, respectively, have the capacity of 2(=$2^1$), the capacitance C54 corresponding to the output of one bit upper comparison circuit 48 has a capacity of 4(=$2^2$), the capacitance C55 corresponding to the output of two bits upper comparison circuit 39 has a capacity of 8(=$2^3$), and the capacitance C51 corresponding to Vin has the capacity of 16(=$2^4$).

In the 0th bit threshold setting circuit 68, the capacitances C62 and C63 corresponding to LV1 and LV2, respectively, have the capacity of 1(=$2^0$), the capacitance C58 corresponding to the output of one bit upper comparison circuit 58 has a capacity of 2(=2), the capacitance C65 corresponding to the output of two bits upper comparison circuit 48 has a capacity of 8(=$2^2$), the capacitance C66 corresponding to the output of three bits upper comparison circuit 48 has a capacity of 8(=$2^2$), and the capacitance C61 corresponding to Vin has the capacity of 16(=$2^4$).

Thus, the threshold setting circuits 38, 47, 57 and 68 are weighting circuits consisting of capacitive couplings that weight and summing up the LV1 and LV2 with weights of a power of 2 for shifting the Vin in level, and output them to the comparison circuits 39, 48, 58 and 69.

The capacities are determined, for example in the MSB (third bit) threshold setting circuit 38, is described. The three input capacitances C34 to C36 are provided that are charged by "0" electric charge in the initial condition. If the Vin, LV1 and LV2 are input to these capacitances, the total electrical charge is zero, and the following formula (1) is obtained. In the formula, V3 is an output of the threshold setting circuit 38.

$$C34(Vin-V3)+C35(LV1-V3)+C36(LV2-V3)=0 \quad (1)$$

The output V3 is expressed as in the formula (2).

$$V3 = \frac{C34 \cdot Vin + C35 \cdot LV1 + C36 \cdot LV2}{C34 + C35 + C36} \quad (2)$$

The output voltage V3 is an weighted addition Vin, LV1 and LV2 by weights of C34 to C36 corresponding to Vin, LV1 and LV2. In the thresholding circuit 38, the input capacitances C34 to C36 have capacity ratio of C34:C35:C36= 16:8:8. Thus, the output of the capacitive coupling is as in the formula (3).

$$V3 = \frac{Vin}{2} + \frac{LV1 + LV2}{4} \quad (3)$$

Since the threshold voltage of the comparison circuit 39 is Vdd/2, the condition of output inversion of the comparison circuit 39 is expressed by the formula (4).

$$\frac{Vin}{2} + \frac{LV1 + LV2}{4} = \frac{Vdd}{2} \quad (4)$$

The input voltage Vin in the case of the formula (4) is called "A7" here, and the formula (5) is obtained.

$$Vin = Vdd - \frac{LV1 + LV2}{2} (\equiv A7) \quad (5)$$

Therefore, when (Vdd−LV1)≦Vin≦A7, the output Vb3 of the comparison circuit 39 is low level, and the output Vb3' of the inverter 40 is high level, and the multiplexer 41 outputs LV1. When A7≦Vin≦(Vdd−LV2), the output Vb3 of the comparison circuit 39 is high level, and the output Vb3' of the inverter 40 is low level and the multiplexer 41 outputs LV2. In the following description, the output of the comparison circuit 39 is deemed to be inverted to high level just in the condition that the input voltage of A7, for easy understanding.

In the second bit thresholding circuit 47, the capacitances C42 to C45 have capacities of C42:C43:C44:C45=16:4:4:8. An output voltage V2 of the capacitive coupling is as in the formula (6).

$$V2 = \frac{Vin}{2} + \frac{Vd3}{4} + \frac{LV1 + LV2}{8} \quad (6)$$

Here, Vd3 is an output of the multiplexer 41. When the output Vb3 of the third bit comparison circuit 39 is low level, the output Vb3' of the inverter 40 is high level, thus Vd3=LV2. The output of thee second bit comparison circuit 48 is inverted when the input voltage Vin is as follows.

When (Vdd−LV1)≦Vin≦A7, the multiplexer 41 outputs LV1 to the capacitance C45. Then, the formula (7) is obtained from the formula (6).

$$\frac{Vin}{2} + \frac{LV1}{4} + \frac{LV1 + LV2}{8} = \frac{Vdd}{2} \quad (7)$$

Therefore, the second bit comparison circuit 48 inverts its output when Vin is a voltage shown in the formula (8).

$$Vin = Vdd - \left(\frac{LV1}{2} + \frac{LV1 + LV2}{4}\right)(= A3) \quad (8)$$

When A7≦Vin≦(Vdd−LV2), the multiplexer 41 outputs LV2. Then, the formula (9) is obtained from the formula (6).

$$\frac{Vin}{2} + \frac{LV2}{4} + \frac{LV1 + LV2}{8} = \frac{Vdd}{2} \quad (9)$$

Therefore, the comparison circuit 48 inverts its output when Vin is a voltage shown in the formula (10). This voltage is called "A11".

$$Vin = Vdd - \left(\frac{LV2}{2} + \frac{LV1 + LV2}{4}\right)(= A11) \quad (10)$$

The output Vb2 of the comparison circuit 48 corresponding to the second bit is low level when (Vdd−LV1)≦Vin≦A3 as well as A7≦Vin≦A11. At this time, the output Vb2' of the inverter 49 is high level, and the multiplexer MUX50 outputs LV1. While, the output Vb2 of the comparison circuit 48 is high level when A3≦Vin≦A7 as well as A11≦Vin≦(Vdd−LV2). At this time, the output Vb2' of the inverter 49 is low level, and the multiplexer MUX50 outputs LV2.

In the first bit threshold setting circuit 57, the capacitances C51 to C55 have capacities of C51:C52:C53:C54:C55= 16:2:2:4:8. An output voltage V1 of the capacitive coupling is as in the formula (11).

$$V1 = \frac{Vin}{2} + \frac{Vd3}{4} + \frac{Vd2}{8} + \frac{LV1+LV2}{16} \quad (11)$$

Here, Vd2 is an output of the multiplexer 50. When the output Vb2 of the second bit comparison circuit 48 is low level, Vd2=LV1 in response to the output Vb2' of the inverter 49. Vd2=LV2, when the output Vb2 of the second bit comparison circuit 48 is high level.

Therefore, the first bit comparison circuit 58 inverts its output under the condition as follows. When Vin<A3, the output Vb3 of the comparison circuit 39 is low level, the output Vb2 of the comparison circuit 48 is low level, thus the multiplexers 41 and 50 output LV1, that is, Vd3=Vd2=LV1. The following formula (12) is obtained from the formula (11).

$$\frac{Vin}{2} + \frac{LV1}{4} + \frac{LV1}{8} + \frac{LV1+LV2}{16} = \frac{Vdd}{2} \quad (12)$$

Therefore, the comparison circuit 58 inverts its output when Vin is a voltage shown in the formula (13). This voltage is called "A1".

$$Vin = Vdd - \left(\frac{LV1}{2} + \frac{LV1}{4} + \frac{LV1+LV2}{4}\right)(=A1) \quad (13)$$

The output Vb3 of the comparison circuit 39 is low level when A3≦Vin≦A7. At this time, the output Vb2 of the comparison circuit 48 is high level. The output of the multiplexer MUX41 is Vd3=LV1, and the formula (14) is obtained from the formula (11).

$$\frac{Vin}{2} + \frac{LV1}{4} + \frac{LV2}{8} + \frac{LV1+LV2}{16} = \frac{Vdd}{2} \quad (14)$$

Therefore, the comparison circuit 58 inverts its output when Vin is a voltage shown in the formula (15). This voltage is called "A5".

$$Vin = Vdd - \left(\frac{LV1}{2} + \frac{LV2}{4} + \frac{LV1+LV2}{8}\right)(=A5) \quad (15)$$

The output Vb3 of the comparison circuit 39 is low level and the output Vb2 of the comparison circuit 48 is high level when A7≦Vin≦A11. The output of the multiplexer MUX41 is Vd3=LV2, and the output of the multiplexer MUX50 is Vd2=LV1. Therefore, the comparison circuit 58 inverts its output when Vin is a voltage shown in the formula (16). This voltage is called "A9".

$$Vin = Vdd - \left(\frac{LV2}{2} + \frac{LV1}{4} + \frac{LV1+LV2}{8}\right)(=A9) \quad (16)$$

The output Vb3 of the comparison circuit 39 is high level when A11≦Vin. At this time, the output Vb2 of the comparison circuit 48 is high level. And Vd3=Vd2=LV2. By substituting the formula (11) by the above, the input voltage for inverting the output of the comparison circuit 58 can be obtained as in the formula (17). This voltage is called "A13".

$$Vin = Vdd - \left(\frac{LV2}{2} + \frac{LV2}{4} + \frac{LV1+LV2}{8}\right)(=A13) \quad (17)$$

Similarly, the input voltage for inverting the output of the comparison circuit 69 can be obtained as in the formula (18).

$$V0 = \frac{Vin}{2} + \frac{Vd3}{4} + \frac{Vd2}{8} + \frac{Vd1}{16} + \frac{LV1+LV2}{32} \quad (18)$$

The input voltages A0, A2, A4, A6, A8, A10, A12, A14 for inverting the output of the comparison circuit 69 are shown in the formulae (16) to (26).

$$A0 = Vdd - \left(\frac{LV1}{2} + \frac{LV1}{4} + \frac{LV1}{8} + \frac{LV1+LV2}{16}\right) \quad (19)$$

$$A2 = Vdd - \left(\frac{LV1}{2} + \frac{LV1}{4} + \frac{LV2}{8} + \frac{LV1+LV2}{16}\right) \quad (20)$$

$$A4 = Vdd - \left(\frac{LV1}{2} + \frac{LV2}{4} + \frac{LV1}{8} + \frac{LV1+LV2}{16}\right) \quad (21)$$

$$A6 = Vdd - \left(\frac{LV1}{2} + \frac{LV2}{4} + \frac{LV2}{8} + \frac{LV1+LV2}{16}\right) \quad (22)$$

$$A8 = Vdd - \left(\frac{LV2}{2} + \frac{LV1}{4} + \frac{LV1}{8} + \frac{LV1+LV2}{16}\right) \quad (23)$$

$$A10 = Vdd - \left(\frac{LV2}{2} + \frac{LV1}{4} + \frac{LV2}{8} + \frac{LV1+LV2}{16}\right) \quad (24)$$

$$A12 = Vdd - \left(\frac{LV2}{2} + \frac{LV2}{4} + \frac{LV1}{8} + \frac{LV1+LV2}{16}\right) \quad (25)$$

$$A14 = Vdd - \left(\frac{LV2}{2} + \frac{LV2}{4} + \frac{LV2}{8} + \frac{LV1+LV2}{16}\right) \quad (26)$$

FIG. 6 is a table showing a relationship between input and output of the comparison circuit in FIG. 2. The input voltages A0 to A14 as substantial thresholds are shown by the formula (27).

$$A0 ... A14 = Vdd - \frac{2^3 Vd3 + 2^2 Vd2 + 2^1 Vd1 + 2^0 Vd0 + LV1}{2^4} \quad (27)$$

As shown in FIG. 6, the full range of between the lower limit (Vdd−LV1) and the upper limit (Vdd−LV2) is converted into a digital data by the A/D converter of the present embodiment.

In the above description, the reference voltage Vref is set Vdd/2, however, another voltage not higher than Vdd may be applicable. The lower and upper limits are (2Vref−LV1) and (2Vref−LV2) regardless of Vref The Vref may be (LV1+LV2)/2. In this case, the lower limit is LV2 and the upper limit is LV1.

It is possible that the A/D conversion accuracy becomes lower because of inaccurate weighting due to residual electrical charge in the input capacitances, so the residual charge can be refreshed by connecting Vref to opposite terminals of the input capacitances. When the refresh signal REFRESH is high level, the multiplexers MUX31 to MUX33 output Vref and the switches 37, 46, 56 and 67 are closed. As a result, the total input capacitances C34 to C36, C42 to C45, C51 to C55, C61 to C66 are connected at their opposite terminals to Vref. The residual charge is refreshed and the conversion accuracy is improved.

Figure 7:
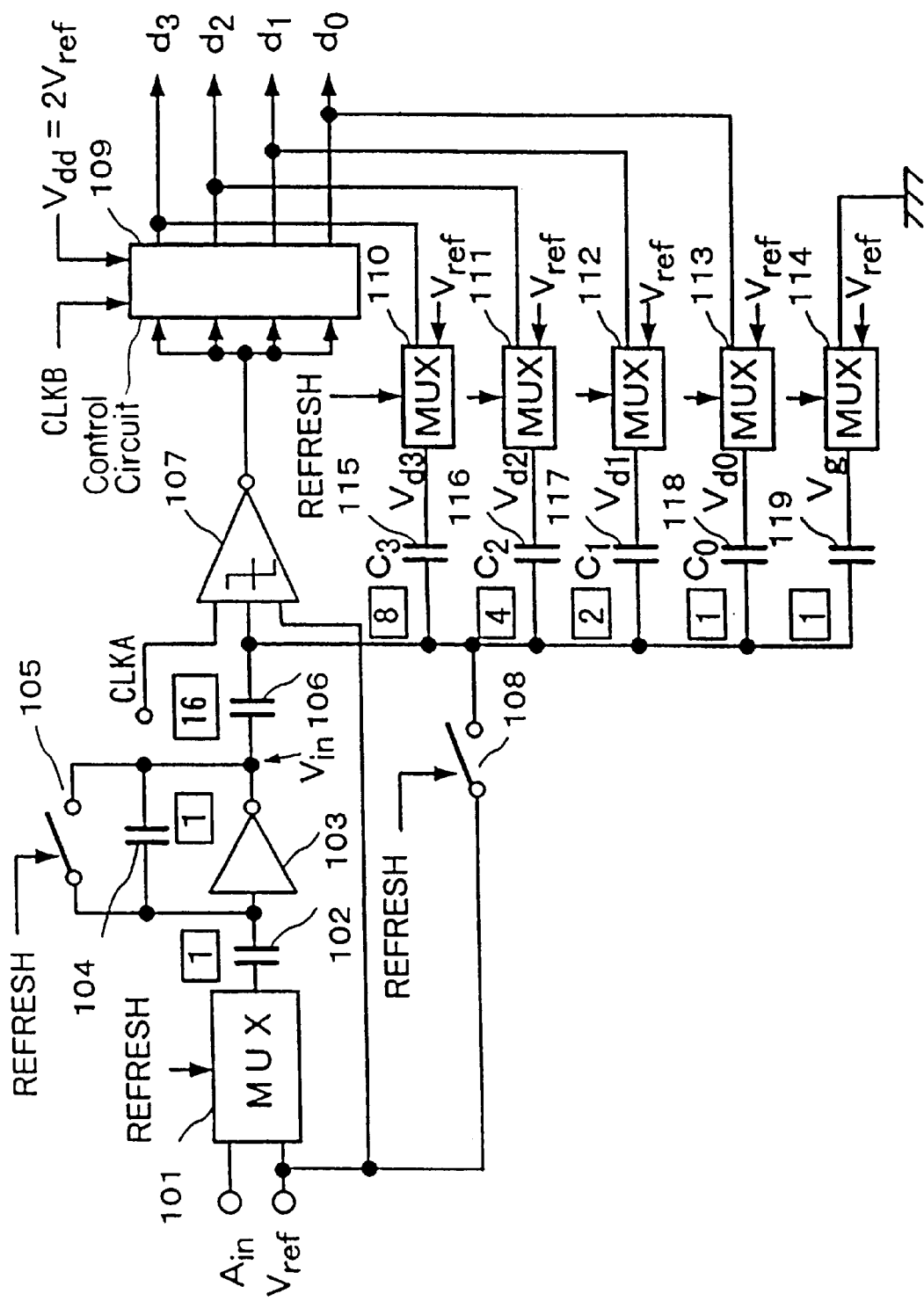
FIG. 7 is a block diagram showing a third embodiment of the A/D converter according to the present invention.

FIG. 7 is a block diagram showing a third embodiment of the A/D converter according to the present invention. In FIG. 7, 101 is a multiplexer, C102 is an input capacitance, 103 is an inverting amplifier, C104 is a feedback capacitance, 105 is a switch, C106 is an input capacitance, 107 is a comparison circuit, 108 is a switch, 109 is a control circuit, 110 to 114 are multiplexers, C115 to C118 are capacitances for controlling thresholds, and C119 is a capacitance for adjusting threshold.

This embodiment is a sequential type A/D converter for converting an analog input voltage Ain into a (m+1) bit digital data of dm to d0, and m+1=4. Since analog input voltage Ain must be kept constant during one time A/D conversion, it is necessary that the analog input voltage Ain itself has a little drift, or that the analog input voltage Ain is once held by a sampling and holding circuits. The analog input voltage Ain is inverted by the inverting amplifier 103 with basis of the reference voltage Vref and input to the comparison circuit 107 as an analog input voltage Vin.

In the comparison circuit 107, the comparison circuits in FIGS. 1 and 2 are used as comparison circuits with inverting which compare the input voltage Vin with the reference voltage Vref synchronously with a clock CLKA. The input capacitance C106 supplies the analog input voltage Vin, of the output voltage of inverting amplifier circuit 103, to an input portion of the comparison circuit 107. The control circuit 109 includes a successive approximation register (SAR) for holding a digital data, which receives the output of the comparison circuit 107 synchronously with a clock CLKB. The digital data held in SAR is successively controlled so as to be an approximation of the Vin. The clocks CLKA and CLKB are to be synchronized with each other.

The capacitances C115 to C118 for controlling the thresholds supply the output voltages of stages of the successive approximation register SAR to the input of the comparison circuit 107. A substantial threshold is determined by a capacitive coupling consisting of C115 to C118 and C119. The comparison circuit 107 has a threshold of Vref=Vdd/2, however the substantial threshold can be varied by supplying the voltage of the SAR to the capacitances C115 to C118 such that the voltage Vin is shifted in level. The output of the comparison circuit 107 is output as a digital data.

The SAR in the comparison circuit 109 gradually converts the analog input voltage Vin into a (m+1) bit digital after repeated inverting of outputs of the digital bits dm to d0. Here, m+1=4. When 15 thresholds are defined, 16 levels (n=4 bits) digital data can be generated. However, in the present embodiment, there are 16(=$2^{m+1}$) thresholds from Vref/8 to 16Vref/8.

The A/D converter above is of small size and low power consumption because its main portion consists of a comparison circuit 107 with a capacitive coupling. The capacitances are refreshed at the initial condition such that undesired electrical charge are cancelled by means of the multiplexers 101, 110 to 1114, switches 105 and 108 are disposed. These components may be MOSFET circuits.

The analog input voltage Vin and the reference voltage Vref are input to the multiplexer 101. The multiplexer 101 outputs Vref when the refresh signal REFRESH is generated, and otherwise Vin. The output of the multiplexer 101 is input through the input capacitance C102 to the inverting amplifier 103 of a CMOS inverter. The feedback capacitance C104 and switch 105 are parallelly connected between the input and output of the inverting amplifier 103. The capacitances C102 and C104 have capacity as follows.

$$C102:C104=1:1 \qquad (28)$$

The output of the inverting amplifier 103 is input through a capacitance C106 to the comparison circuits 107. The output of the input capacitance C106 is connected to the switch 108 for inputting the reference voltage when the REFRESH is generated.

The output of the comparison circuit 107 is input to the control circuit 109. The control circuit 109 works sequentially synchronously with the clock CLKB. The output of the SAR in the control circuit 109 is a parallel digital output and is input through the first input portion of the multiplexers MUX110 to 113 to the capacitances C115 to C118. Thus, the substantial threshold of the comparison circuit 107 is adjusted. The outputs of the multiplexers 110 to 113, and 114 are supplied through the capacitances C115 to C118 to the input portion of the comparison circuit 107. The multiplexers 110 to 114 output Vref when the REFRESH is generated, and otherwise, the multiplexers 110 to 113 output the output of SAR and the multiplexer 114 outputs the ground voltage "0".

The capacitances C106, C115 to C118, and C119 have capacities as follows.

$$C106:C115:C116:C117:C118:C119=16:8:4:2:1:1 \qquad (29)$$

At the initial condition before the A/D conversion, the capacitances are refreshed. The multiplexer 101 is switched to supply the Vref to the input capacitance C102 when the REFRESH is input, then the input and output of the inverting amplifier 103 is short-circuited by the switch 105. As a result, the electrical charge of the capacitances C102 and C104 are cancelled. The Vref is also input to the input of the capacitance C106. The input and output of the capacitance C106 is short-circuited by the switch 8 when the REFRESH is input, and the multiplexers 110 to 114 is switched to supply the Vref to the capacitances C115 to C118 and C119. Thus, the residual electrical charge is cleared.

Next, a performance of the inverting amplifier 103 is described. The inverting amplifier 103 includes three stages CMOS inverters serially connected and works in a linear area of the CMOS inverters. The voltage of the input portion of the inverting amplifier 103 is substantially equal to Vref, that is a theoretical threshold of the inverting amplifier 103, when the input portion is isolated from the supply voltage. The Vref is designed to be Vdd/2.

When an output voltage of the inverting amplifier is Aout, the following formula (30) is obtained according a principle of preservation of electrical charge.

$$C102 \cdot (Ain - Vref) + C104 \cdot (Aout - Vref) = 0 \qquad (3o)$$

This formula is rewritten according to the formula (28).

$$(Aout - Vref) = -(Aini - Vref) \qquad (31)$$

The Vin and Vout have equal absolute values and opposite polarities in basis of the Vref. The inverting amplifier 103 can be substituted by an operational amplifier. The capacitive coupling can be substituted by an input resistance and a feedback resistance. The electrical power consumption of the embodiment above is less than that of the circuit of the operational amplifier.

The performance of the comparison circuit 107 is described next. In the comparison circuit 107, the comparison circuits in FIGS. 1 and 2 are used as inverting comparison circuits, and the threshold of the comparison circuit is Vref−Vdd/2.

When an output voltages of the output terminals D3 to D0 are Vd3 to Vd0, the following formula (32) is obtained according a principle of preservation of electrical charge.

$$C106 \cdot (Vin-Vref)+C115 \cdot (Vd3-Vref)+C116 \cdot (Vd2-Vref)+C117 \cdot (Vd1-Vref)+C118 \cdot (Vd0-Vref)+C119 \cdot (0-Vref)=0 \quad (32)$$

This formula is rewritten according to the formula (29).

$$Vin - Vref = \quad (33)$$

$$-\frac{Vd3 - Vref}{2^1} - \frac{Vd2 - Vref}{2^2} - \frac{Vd1 - Vref}{2^3} - \frac{Vd0 - Vref}{2^4} - \frac{-Vref}{2^4}$$

If CLKA falls when Vin is higher than a voltage determined by the formula (33), the output of the comparison circuit 107 becomes nearly to "0" lower than the Vref due to a high gain of the comparison circuit 107. While, if CLKA falls when Vin is lower than a voltage determined by the formula (33), the output of the comparison circuit 107 becomes nearly to Vdd=2Vref higher than the Vref. Thus, the Vin is substantially the threshold voltage Vth of the comparison circuit 107. By transferring the Vth to the left side, the formula (33) is rewritten as in the formula (34).

$$Vth = 2Vref - \frac{2^3 Vd3 + 2^2 Vd2 + 2^1 Vd1 + 2^0 Vd0}{2^4} \quad (34)$$

The output voltages Vd3, Vd2, Vd1 and Vd0 at the output terminals d3, d2, d1 and d0 of the control circuit 9 are Vdd=2Vref when the digital data is "1", and "0" when the digital data is "0". These outputs are symmetric with respect to the Vref.

FIG. 8 is a table showing a relationship between input and output of the comparison circuit in FIG. 7. The substantial thresholds obtained by the formula (34) are shown concerning the total digital value of d3, d2, d1 and d0. When (d3,d2,d1,d0)=(0,0,0,0), Vth is the maximum, Vth=16Vref/8=2Vref−Vd1. When (d3,d2,d1,d0)=(1,1,1,1), Vth is the minimum, Vth=Vref/8=Vdd/16. The minimum value corresponds to quantization resolution as well as to a voltage of 1bit.

As described later with reference to FIG. 10, if the control circuit 109 outputs (d3,d2,d1,d0)=(0,0,0,0) when the sequential comparison is completed, the analog input voltage Vin is in a range between $$\frac{15}{8} Vref \leq Vin < \frac{16}{8} Vref.$$

If the control circuit 109 outputs (d3,d2,d1,d0)=(1,1,1,1), the analog input voltage Vin is in a range between $$0 \leq Vin < \frac{1}{8} Vref.$$

Vin equal to the threshold is deemed as a voltage more than the threshold for easy understanding. Thus, the analog input voltage Vin between 0 to 2Vref is quantized into 16 levels and expressed by a 4bit digital value.

The analog input voltage Vin is an inversion of Ain in basis of Vref. The substantial threshold Vth for the analog input voltage Ain is expressed by the table of FIG. 8 vertically and symmetrically inverted at a symmetric center of the row (1,0,0,0) corresponding to Vth(=8Vref/8).

In FIG. 7, the output of the control circuit 109 is 4bit as an example, and it is generalized as in the formula (32).

$$C_{in}(Vin-Vref)+C_m(Vd_m-Vref)+C_{m-1}(Vd_{m-1}-Vref)+ \ldots +C_1(Vd_1-Vref)+C_0(Vd_0-Vref)+C_g(-Vref)=0 \quad (35)$$

The capacitances $C_m \sim C_0$ has capacities corresponding to weights of outputs of control circuit 109.

$$C_{i-1} = 2^{i-1} C_0$$

$$C_{in} = 2^{m+1} C_0 (=C_m + C_{m-1} + \ldots + C_1 + C_0 + C_0) \quad (36)$$

Here, i is an integer from 1 to (m+1). Further, the capacitance for threshold adjustment is $C_g = C_0$. The formula (379 is obtained.

$$Vin - Vref = -\frac{Vd_m - Vref}{2^1} - \frac{Vd_{m-1} - Vref}{2^2} - \frac{Vd_{m-2} - Vref}{2^3} \ldots - \frac{Vd_0 - Vref}{2^n} - \frac{0 - Vref}{2^n} \quad (37)$$

When the outputs dm, dm−1, . . . , d1, d0 of the control circuit 109 are "0", and $Vd_m = Vd_{m-1} = Vd_{m-2} = \ldots = Vd_0 =$ 2Vref, Vin is the substantial threshold and 2Vref=Vdd.

When the outputs dm, dm−1, . . . , d1, d0 of the control circuit 109 are "1" and $Vd_m = Vd_{m-1} = Vd_{m-2} = \ldots = Vd_0 =$ 2Vref, Vin is the substantial threshold and $$\frac{Vref}{2^m} = \frac{Vdd}{2^{m+1}}.$$

These are the quantization resolution.

In the above embodiment, the capacitances C106, C115 to C118, and C119 have capacities of predetermined ratio, and the analog input voltage between "0" and Vdd is proportional to the digital output. However, the capacity ratio may be changed according to the desired A/D conversion characteristics.

The capacitance C119 may have any capacity for changing the substantial threshold Vth linearly. It causes a voltage offset of the relationship between the analog input and digital output. This adjustment can be realized by changing not the capacity but the voltage energized on the C119. It is also possible to remove the capacitance C119. The substantial threshold can be adjusted by changing the capacity ratio from that in the formula (36).

Figure 9:
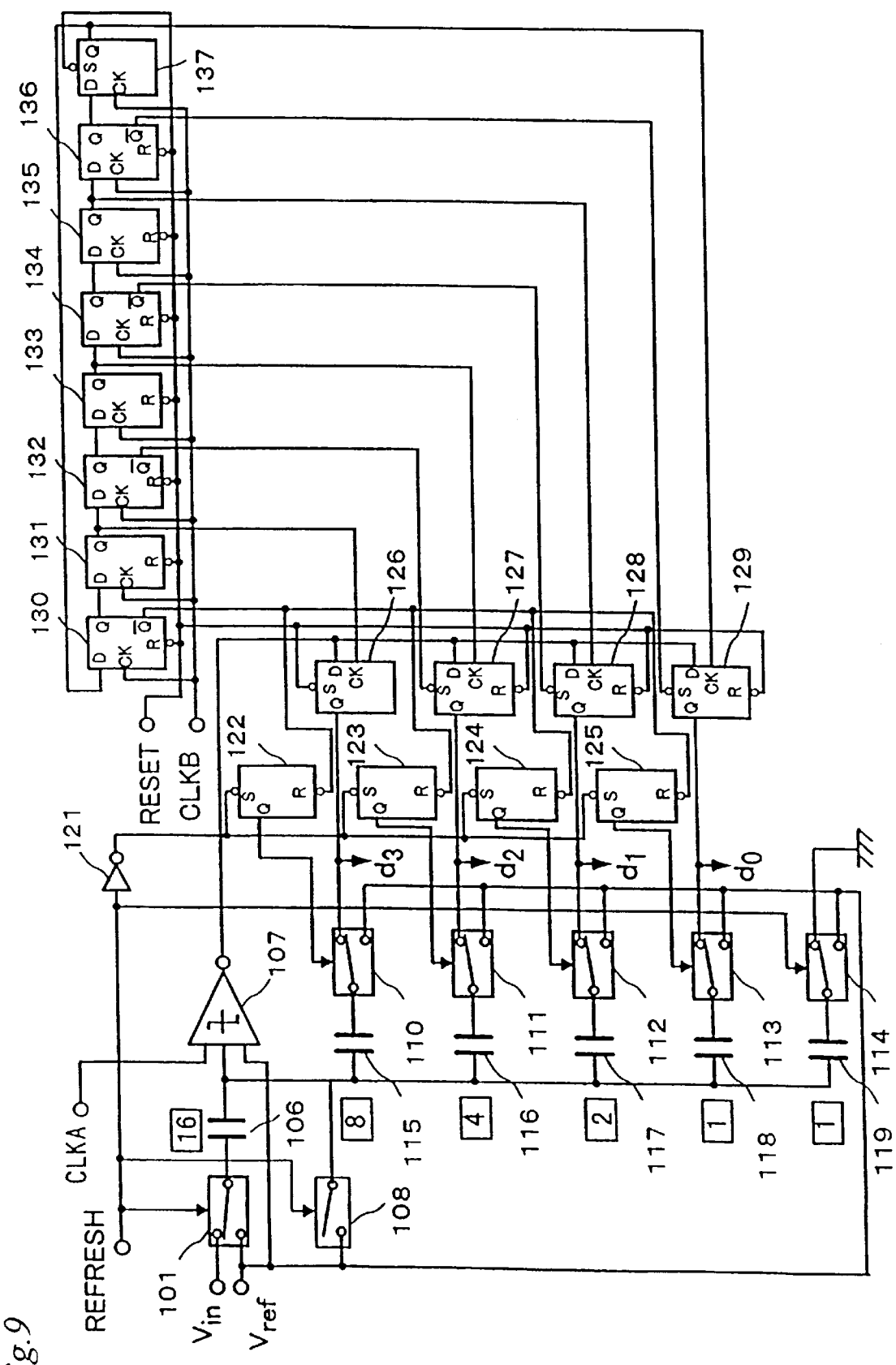
FIG. 9 is a detailed circuit diagram showing the A/D converter in FIG. 7.

FIG. 9 is a detailed circuit diagram showing the A/D converter in FIG. 7. In FIG. 7, the input side portion of the inverting amplifier 103 is omitted. Similar portions to those in FIG. 7 are designated by the identical references. In FIG. 9, 121 is an inverter, 122 to 125 are RS flip-flops, and 126 to 137 are D flip-flops. In a practical circuit, it is better to connect input terminal without any input voltages to a voltage such as a supply voltage in order to prevent erroneous output.

The RS flip-flops 122 to 125 control the multiplexers 110 to 113 such that the Vref is supplied to the capacitances C115 to C118 for refreshment. The D flip-flops 126 to 129 are the successive approximation resister (SAR) as the main component of the control circuit 109 in FIG. 7. The D flip-flops 126 to 129 output the digital data d3 to d0 and supply the supply voltage Vdd=2Vref or the ground voltage "0" through the multiplexers 110 to 113 to capacitances C115 to C118. The D flip-flops 130 to 137 are a ripple counter for controlling the RS flip-flops 122 to 125 and D flip-flops 126 to 129.

The signal REFRESH is input through the inverter 121 to a set terminal S of the RS flip-flops 122 to 125. Reset terminals R of the RS flip-flops 122 to 125 are connected to an inverted Q terminal of the D flip-flop 130. Output terminals of the RS flip-flops 122 to 125 are connected to control terminals of the multiplexers 110 to 113.

The D flip-flop 126 has at least a set S terminal. The D flip-flops 127 to 129 have set S terminals and reset R terminals. The signal RESET is input to the set terminal S of the D flip-flop 126 and the reset R terminals of the D flip-flops 127 to 129. The set S terminals of the D flip-flops 127 to 129 are connected to the inverted Q terminals of the D flip-flops 132, 134 and 136. The flip-flops 126 to 129 are successively and compulsorily set to "1". The output of the comparison circuit 107 is commonly input to the D input terminals of the D flip-flops 126 to 129. Clock input terminals CK of the D flip-flops 126 to 129 are connected to Q output terminals of the D flip-flops 131, 133, 135 and 137 which successively receive the output of the comparison circuit 107.

The D flip-flops 130 to 136 have at least reset R terminals, the D flip-flop 137 has at least set S terminal. The D flip-flops 130 to 136 are reset and the D flip-flop 137 is set by the signal RESET. The D flip-flops 130 to 136 are serially connected one after another, and the Q output terminal of each D flip-flop (130 to 136) is connected to the D input terminal of the following D flip-flop (131 to 137). The Q output terminal of the last D flip-flop 137 is connected to the D input terminal of the first D flip-flop 130. The clock signal CLKB is commonly input to the D flip-flops 130 to 137. When the D flip-flop 137 is set by the reset signal RESET, the Q output "1" of the D flip-flop 137 is circulated through the D flip-flops 130 to 137 in response to the clock signal CLKB. The D flip-flops 130 to 137 work as a ripple counter which controls the RS flip-flops 122 to 125 and D flip-flops 126 to 129 in response to the Q output and the inverted Q output.

Figure 10:
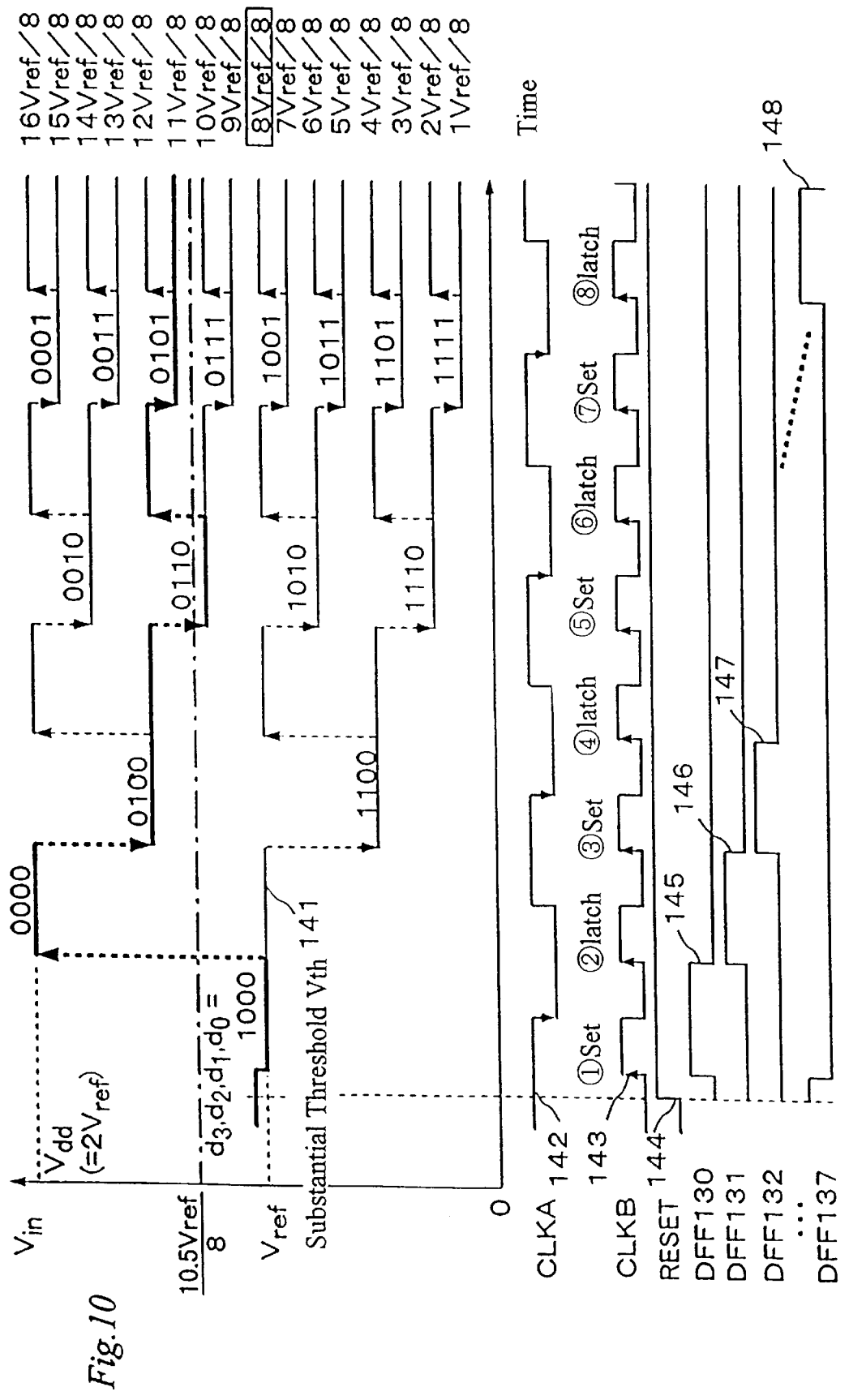
FIG. 10 is a timing chart of the A/D converter in FIG. 9.

FIG. 10 is a timing chart of the A/D converter in FIG. 9. In the upper portion, the analog input voltage Vin is shown by a vertical coordinate and a horizontal coordinate represents "time". The change of the substantial threshold Vth of the comparison circuit 107 is shown by thick solid lines. The lower portion shows wave form of various signals.

Figure 11:
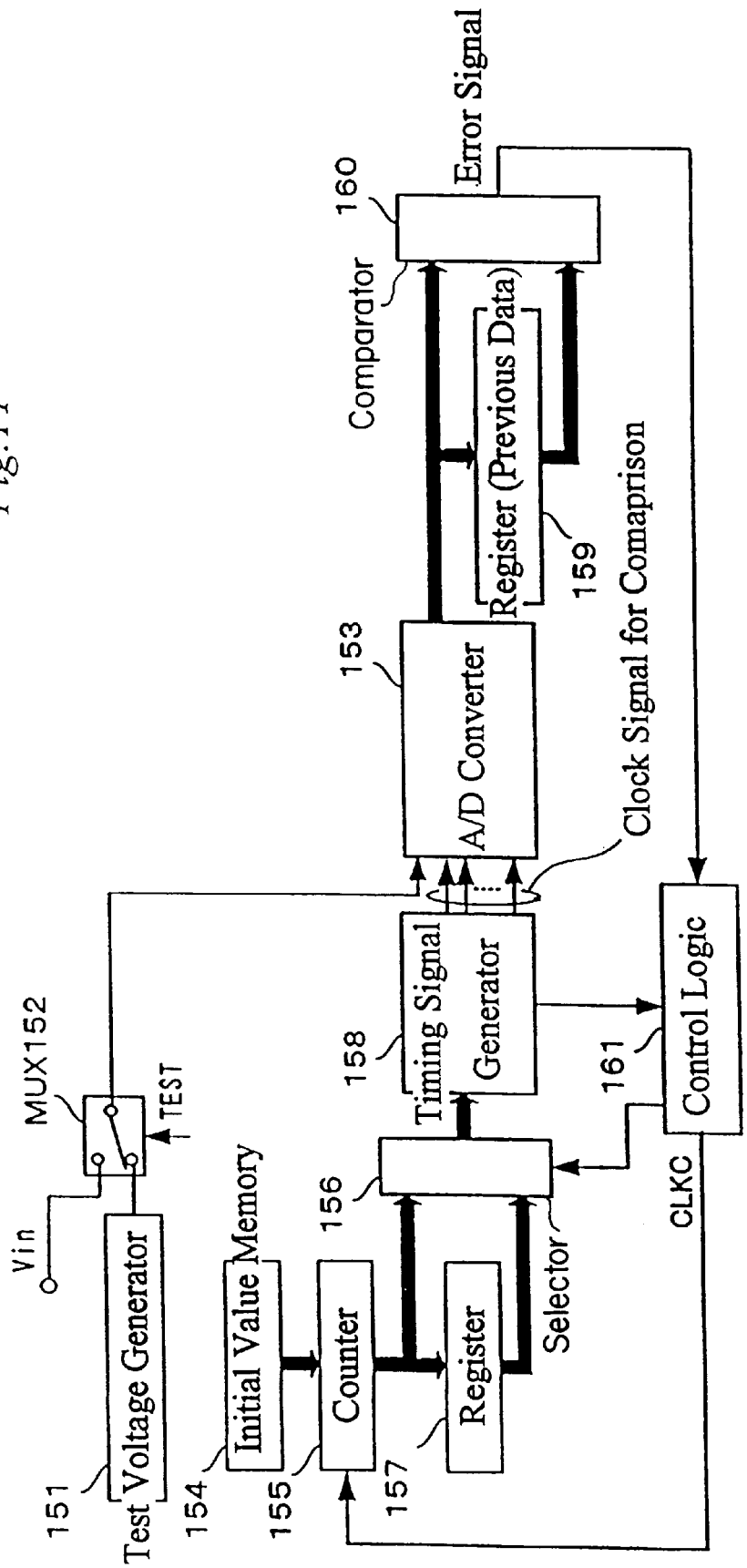
FIG. 11 is a block diagram showing the A/D converter with peripheral circuits for setting timing of the A/D converter.

141 shows the substantial threshold Vth, 142 is the clock signal CLKA for comparison, 143 is a clock signal for sequential control, 144 is a reset signal RESET, 145 to 148 are Q output wave forms of the D flip-flops 130 to 136 in FIG. 11. In FIG. 11, the refreshment is not shown. A performance is described with respect to a case of the input voltage of 10.5Vref/8.

At leading edges ①, ③, ⑤ and ⑦ of the CLKB, the substantial threshold is set through the capacitances C115 to C118 in response to the output d3 to d0. At leading edges ②, ④, ⑥ and ⑧ of the CLKB, the D flip-flops 126 to 129 receive and latch the output of the comparison circuit 107. The clock CLKA falls from the high level to the low level when the substantial threshold is stable after the setting of the substantial threshold at the timing of the leading edges ①, ③, ⑤ and ⑦. Then, the comparison circuit 107 performs the comparison. The clock CLKA rises from the low level to the high level such that the waiting mode starts, after the output of the comparison circuit 107 is received by the D flip-flops 126 to 129.

The comparison clock CLKA falls from high the level to the low level just before the leading edges ②, ④, ⑥ and ⑧ for comparison and returns to the high level after the completion of the holding of the comparison result. For example, a clock generated by dividing the CLKB may be used, that falls and rises between ① and ②, rises and falls between ② and ③, and falls between ③ and ④. Then, similar cycles are repeated.

Since the comparison output is not latched if the comparison is performed at the leading edges ①, ③, ⑤ and ⑦, a clock CLKA may be used of a timing slightly in advance of the clock CLKB. It means the CLKB may be slightly delayed with respect to the CLKA.

The reference voltage Vref is input through the multiplexers 110 to 113 to the capacitances C115 to C118 when the RESET is not "0" after the refreshment. The substantial threshold Vth (141) is Vth=17Vref/16, because the ground voltage "0" is input through the multiplexer 114 to the capacitance C119.

When the RESET becomes "0", the D flip-flop 126 is set, the D flip-flops 127 to 129 are reset and (d3,d2,d1,d0)=(1, 0,0,0). However, the substantial threshold is not changed because the multiplexers 110 to 113 are not switched.

At the first leading edge ① of the CLKB after the RESET returns to "1", the D flip-flop 130 outputs at the inverted Q output terminal "0". Thus, the RS flip-flops 122 to 125*b* are reset, the multiplexers 110 to 113 are switched, the Vdd= 2Vref is input to the capacitance C115, and the ground voltage "0" is input to the capacitances C116 to C118. The ground voltage "0" is supplied to the capacitance C119 in other cases than the refreshment. The substantial threshold Vth(141) becomes Vref. When the Vin is 10.5Vref/8, the output of the comparison circuit 107 is less than the Vref. The D input terminals of the D flip-flops 126 to 129 are "0".

At the next leading edge ② of the CLKB, the D flip-flop 130 outputs at the inverted Q output terminal "1", and the Q output of the D flip-flop 131 rises "1". The D flip-flop 126 latches the output "0" of the comparison circuit 107, and outputs (d3,d2,d1,d0)=(0,0,0,0), thus, the substantial threshold Vth(141) becomes 16Vref/8. When the Vin is 10.5Vref/ 8, the output of the comparison circuit 107 exceeds the Vref, and the D input terminals of the D flip-flops 126 to 129 are "1".

At the leading edge ③ of the CLKB, the Q output of the D flip-flop 131 returns to "0", while the inverted Q output of the D flip-flop 132 becomes "0". Thus, the D flip-flop 127 is newly set, and the outputs of the D flip-flops 126 to 129 are (0,1,0,0). The substantial threshold Vth(141) is 12Vref/8 as shown in FIG. 8. When the Vin is 10.5Vref/8, the output of the comparison circuit 107 exceeds Vref, and the D input terminals of the D flip-flops 126 to 129 are kept "1".

At the leading edge ④ of the CLKB, the inverted Q output terminal of the D flip-flop 132 returns to "1", while the Q output of the D flip-flop 132 returns to "1". The D flip-flop 127 latches the output "1" of the comparison circuit 107. Since this output is equal to that in the previous timing, and outputs (d3,d2,d1,d0)=(0,1,0,0) and the substantial threshold Vth(141) are not changed.

At the leading edge ⑤ of the CLKB, the Q output of the D flip-flop 133 returns to "0", while the inverted Q output of the D flip-flop 134 becomes "0". Thus, the D flip-flop 128 is newly set, and the outputs of the D flip-flops 126 to 129 are (0,1,1,0). The substantial threshold Vth(141) is 10Vref/8 as shown in FIG. 8. When the Vin is 10.5Vref/8, the output of the comparison circuit 107 is less than Vref, and the D input terminals of the D flip-flops 126 to 129 become "0".

At the leading edge ⑥ of the CLKB, the inverted Q output terminal of the D flip-flop 134 returns to "1", while the Q output of the D flip-flop 135 rises "1". The D flip-flop 128 latches the output "0" of the comparison circuit 107, and the outputs of the D flip-flops 126 to 129 return to (0,1,0,0).

At the leading edge ⑦ of the CLKB, the Q output of the D flip-flop 135 returns to "0", while the inverted Q output of the D flip-flop 136 becomes "0". Thus, the D flip-flop 129 is newly set, and the outputs of the D flip-flops 126 to 129 are (0,1,0,1). The substantial threshold Vth(141) is 11Vref/8 as shown in FIG. 8. When the Vin is 10.5Vref/8, the output of the comparison circuit 107 exceeds the Vref, and the D input terminals of the D flip-flops 126 to 129 become "1".

At the leading edge ⑧ of the CLKB, the inverted Q output terminal of the D flip-flop 136 returns to "1", while the Q output of the D flip-flop 137 rises "1". The D flip-flop 129 latches the output "1" of the comparison circuit 107, and the outputs of the D flip-flops 126 to 129 return to (0,1,0,1).

One cycle of A/D conversion is completed as mentioned above, and the output (d3,d2,di,d0)=(0,1,0,1) of the D flip-flops 126 to 129 are A/D conversion outputs. The digital value indicates that the Vin exceed 10Vref and less than 11Vref/8. The substantial threshold Vth(141) takes 16 values as shown in FIG. 10.

The reset signal RESET is again input to the A/D converter for resetting, and the above operations are repeated. If the analog input voltage Vin is supplied from a sampling and holding circuit, the rest by the RESET is performed after the next analog input voltage Ain is input to the multiplexer 101. A new analog input voltage Ain can be sampled and held at the next timing. The refreshment may be performed every time before input of Ain for A/D conversion.

The output terminals d3 to d0 of the A/D converter are output from the Q outputs of the D flip-flops 126 to 129 in the above embodiment, however, they can be output from the multiplexers 110 to 113.

Since the reception of the output of the comparison circuit 107 by the SAR and the compulsory set of "1" for judging the next stage are alternatively took place, at most one bit of d3 to d0 is changed at one timing. It takes 8 clocks cycles for 4bit A/D conversion. The data latch of the comparison output and the setting of the substantial threshold for the next comparison may be simultaneously performed by changing the control circuit 109 in FIG. 7, as in the conventional successive comparison circuit using resistance coupling.

It takes a time in the successive comparison type A/D converter of FIGS. 7 and 9 until the output from the capacitive coupling becomes stable, similarly to the A/D converter in FIG. 5. Due to an inner resistance of the multiplexers 110 to 114, the capacity of capacitances C106 and C115 to C119 and so forth, a delay time (set-up time) is necessary for a stable substantial threshold. If the comparison output were held by SAR when the comparison is not completed, incorrect A/D conversion would be performed.

The one clock cycle Δ of the clocks $CLM_m$ to $CLK_0$ in the A/D conversion of the A/D converter are determined according to the set-up time of stable output. On the other hand, the set-up time depends on deviation of manufacturing, and a high speed processing by the high speed clocks CLK and CLKA is desired.

FIG. 11 is a block diagram showing the A/D converter with peripheral circuits for setting timing of the A/D converter.

In FIG. 11, 151 is a test voltage generator, 152 is a multiplexer, 153 is the A/D converter, 154 is an initial value register, 155 is a counter, 156 is a selector, 157 and 159 are registers, 158 is a timing signal generator, 160 is a comparator, and 161 is a control logic.

In this A/D converter, comparison clocks an other timing periods are minimized with reviewing the characteristics of the A/D conversion performance in order to improve the A/D conversion speed.

The multiplexer 152 receives the analog input voltage Vin and a test voltage generated in the test voltage generator 151, which alternatively outputs these voltages to the A/D converter 153. The test voltage is selected according to a test mode signal from the control logic 161. An initial value indicating a longest reference clock is stored in the initial value register 154. The initial value is loaded to the counter 155 in response to a load signal (not shown) from the control logic 161. The counter 155 decreases the initial value in response to a clock signal CLKC. A count value of the counter 155 is input to the selector 156 as a reference cycle.

The counter 155 generates the reference cycle gradually decreased and the A/D converter 153 converts the analog input voltage Vin into a digital data synchronously to the reference cycle. One reference cycle is transferred to from the counter 155 to the register 154 to be stored, and the next reference cycle is generated in the counter 155. The counter 155 and the register 157 are connected to thee selector 156 which selects the count value in the counter 155 or the previous value in the register 157, alternatively, in response to a control signal (not shown) from the control logic 161. In the normal condition, the output from the counter 155 is selected. An output of the selector 156 is input to the timing signal generator 158.

The timing signal generator 158 generates a reference clock signal, and one or more clock signals for comparison according to the reference clock. If the A/D converter 153 is the circuit shown in FIGS. 3 and 4, the clock signals are $CLK_m$ to $CLK_0$, if the A/D converter 153 is the circuit shown in FIGS. 7 and 9, the clock signals CLKA and CLKB and reset signal RESET are generated.

In the A/D converter in FIGS. 5, 7 and 9, when the refresh is performed at a timing synchronous with the clock signal, the refresh signal is to be also generated. A sampling and holding is incorporated within the A/D converter, a timing signal for sampling and holding is to be generated. A signal indicative of the completion of the A/D conversion is supplied to the timing signal generator 158 and to the control logic 161.

The timing signal generator 158 generates the clock signals of a period in proportion to that of the reference signal. When the one time A/D conversion is performed by the clocks successively delayed, or when the timing signals such as clock signals delayed from the reference signal are necessary, the delay time is proportional to the reference clock. If the period of the reference clock is much shorter than the clocks for comparison, these clocks can be generated by dividing the reference clock.

In a test mode, a voltage of the test voltage generator 151 is input through the multiplexer 152 to the A/D converter 153 which performs the A/D conversion at a timing of the clocks generated by the timing signal generator 158. The register 159 temporally stores an output data of the A/D converter 153, as a previous data, on completion of the A/D conversion in response to a load signal from the control logic 161. The comparator 159 compares the current output of the A/D converter 153 with the previous data and outputs an error signal to the control logic 161 when they are not identical with each other.

The control logic 161 outputs the clock signal CLKC for setting on the completion of the A/D conversion for down-counting of the counter 155, if the error signal is not input. The control logic 161 controls the selector 156 such that the counter output is output to the timing signal generator 158. The period of the clocks for comparison is gradually shortened by repeating the process above.

The comparison circuit in FIGS. 1 and 2 holds the comparison result just after the comparison, the output becomes predetermined value depending on a circuit inside in a waiting mode. In the A/D converter of FIG. 2, the output becomes high level when waiting representing digital "1". The A/D converter in FIG. 5 outputs (1,1,1,1) when waiting.

Since inner resistance of the transmission gates of the multiplexers 31 to 33, 41, 50 and 60, and input capacitances connected to these multiplexers construct RC time constants, a delay time exists after the waiting until the output voltages of the threshold setting circuits 38, 47, 57 and 68 become stable.

If the comparison clock CLK3 to CLK0 do not have enough period, the A/D converter 153 outputs erroneous output due to unstable threshold. While, in the A/D converter of successive comparison type including the SAR, if each comparison period is not enough, an erroneous output is generated.

The comparator 160 compares the output of the A/D converter 153 and the output stored in the register 159 each time one time A/D is completed, in response to a control signal (not shown) from the control logic 161. When the erroneous output occurs, the current output differs from the previous output in the register 159 and the comparator 160 outputs an error signal. On receiving the error signal, the control logic 161 stops the CLKC by controlling the selector 156, and outputs the previous count value stored in the register 157 to the timing signal generator 158. Thus, the timing signal generator 158 fixedly sets the clock period and terminates the test mode.

The data in the register 157 may be other counter output than the previous data such as a data before several cycles, for easy control.

In the normal working mode, the timing signal generator 158 generates the comparison signals based on the reference clock signal determined during the test mode and supplies them to the A/D converter 153. The A/D converter 153 receives the analog input signal Vin from the multiplexer 152.

The above test mode can be took place in any circuits including the A/D converter 153 or in any application circuits thereof, when refreshed.

The circuits shown in the FIG. 11 may be formed on one LSI chip. A LSI may be formed including the A/D converter 153, the clock generating and distributing portion 158, and the register 157. An outer testing apparatus is connected to the LSI for supplying the test voltage to the LSI with inputting the reference clock gradually shortened. Then the outputs of the A/D conversion are compared with each other. The clock period is stored in the register 157.

Figure 12:
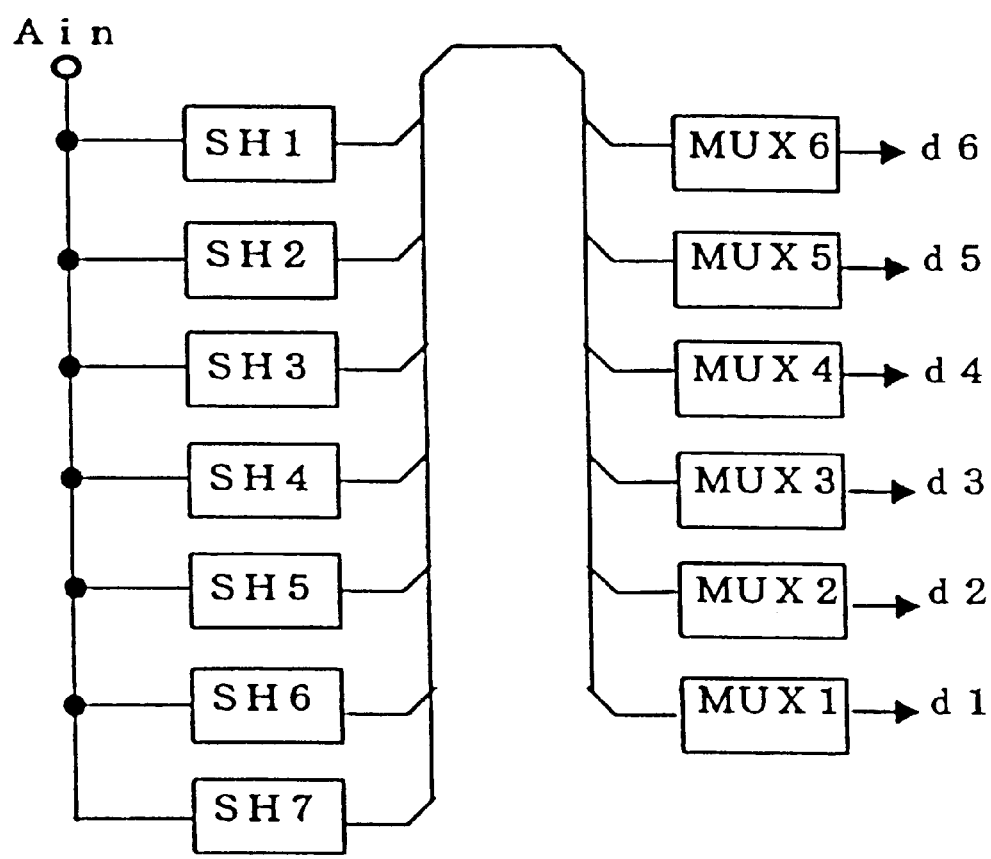
FIG. 12 is a block diagram showing an input side portion of a fourth embodiment of an A/D converter according to the present invention.
Figure 13:
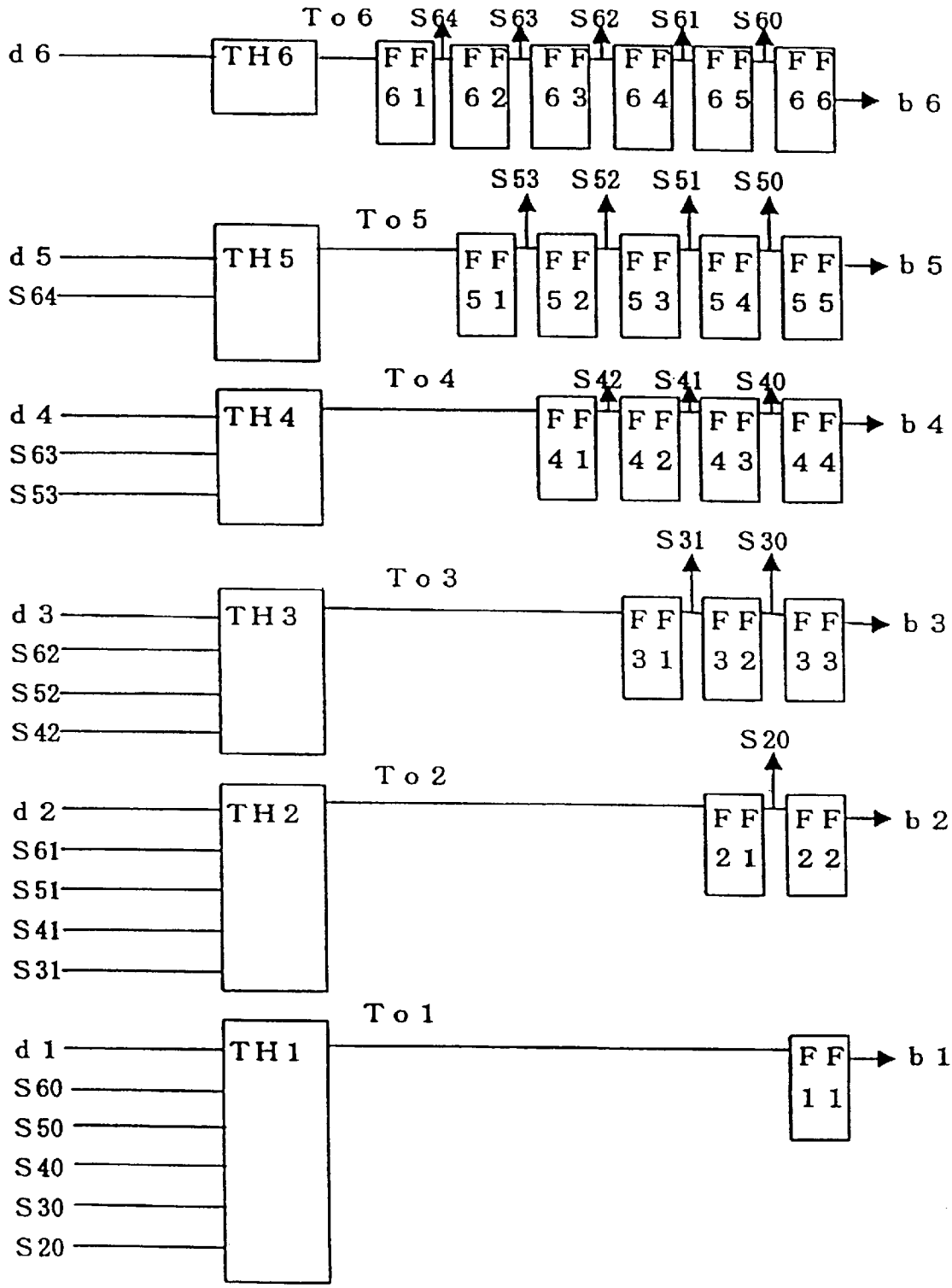
FIG. 13 is a block diagram showing an output side portion of the fourth embodiment of an A/D converter according to the present invention.

FIG. 12 is a block diagram showing an input side portion of a fourth embodiment of an A/D converter according to the present invention, and FIG. 13 is a block diagram showing an output side portion of this embodiment.

The successive comparison type A/D converter includes sampling and holding circuits SH1 to SH7 parallelly connected to the analog input voltage Vin, which holds the analog input voltage in time sequence. After the input voltage is held the last sampling and holding circuit, the sampling and holding is started from the sampling and holding circuit SH1. A plurality of multiplexers MUX1 to MUX6 corresponding to each bit of the digital output. The multiplexer MUX1 to MUX6 successively output the data in one of the sampling and holding circuits SH1 to SH7.

When outputs of the multiplexers MUX1 to MUX6 are d1 to d6, respectively, these outputs are input to threshold circuits TH1 to TH6. Outputs of the threshold circuits TH1 to TH6 are input to holding circuits of one or more stages. In this embodiment, number of bits of the digital output is "6", the output bits are b1 to b6 from the LSB to the MSB. The number of the sampling and holding circuits is more than the number of bits by "1". It means that the output timing is redundant.

A holding circuit for the LSB b1 includes a flip-flop FF11 for holding the data by one stage. The second holding circuit for b2 from the LSB includes two stages flip-flops FF21 and FF22, the third holding circuit for b3 from the LSB includes three stages flip-flops FF31 to FF33, the fourth holding circuit for b4 from the LSB includes five stages flip-flops FF51 to FF55, the fifth holding circuit for b5 from the LSB includes five stages flip-flops FF51 to FF55, the sixth holding circuit for b6 from the LSB includes six stages flip-flops FF61 to FF66. These holding circuits hold data by stages of one, two, three, four, five and six. The data transfer timing of the holding circuits are in synchronism with the data holding timing of the sampling and holding circuits SH1 to SH7, which are driven by an identical clock. The sampling and holding circuits hold the data from when the time one clock after the data holding until when the total 6 data are held.

Figure 14:
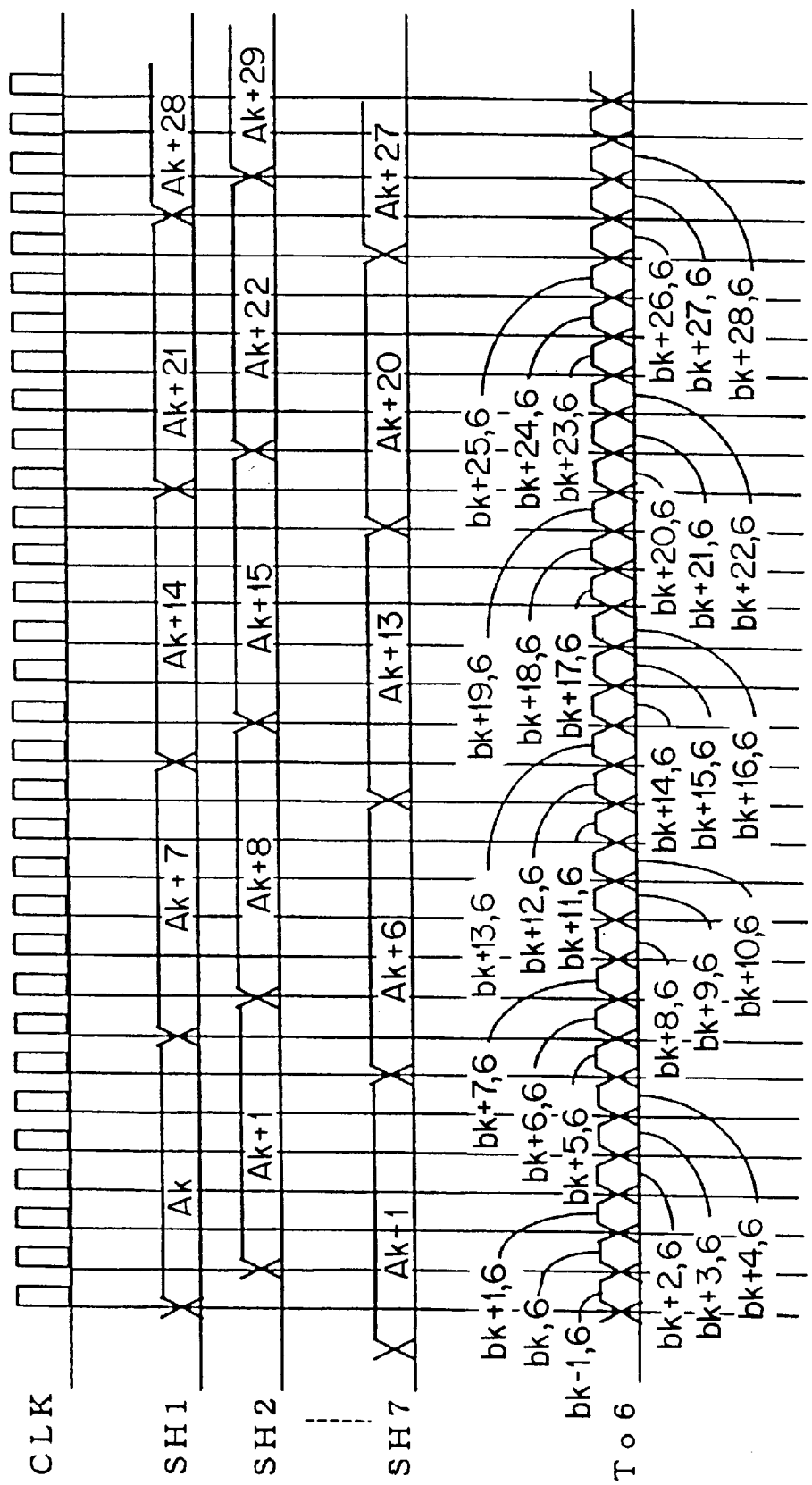
FIG. 14 is a timing chart of the A/D converter in FIGS. 12 and 13.

FIG. 14 is a timing chart of the A/D converter in FIGS. 12 and 13. In FIG. 14, CLK is a reference clock for a basis of the total components. The analog signal voltages are Ak−1, Ak, Ak+1, . . . , and the MSB of the digital signal corresponding to the analog signal are $b_{k-1,6}$, $b_{k,6}$, $b_{k+1,6}$, . . . .

In FIG. 14, the SH1 holds Ak, one clock after the SH2 holds Ak+1, then, on every clocks SH3, SH4 . . . . hold Ak+2, Ak+3 . . . . One clock after the SH7 holds Ak+6, the Sh1 holds Ak+7, and similar holding is repeated. The thresholding circuit TH6 corresponding to the MSB outputs $b_{k,6}$ one clock after the SH1 holds Ak, on every clocks the MSB $b_{k+1,6}$, $b_{k+2,6}$, . . . corresponding to Ak+1, Ak+2, . . . . TH5 outputs $b_{k,5}$, $b_{k+1,5}$, $b_{k+2,5}$ . . . one clock after TH6. TH4 outputs $b_{k,4}$, $b_{k+1,4}$, $b_{k+2,4}$ . . . two clocks after TH6. TH3 outputs $b_{k,3}$, $b_{k+1,3}$, $b_{k+2,3}$ . . . three clocks after TH6. TH2 outputs $b_{k,3}$, $b_{k+1,3}$, $b_{k+2,3}$ . . . four clocks after TH6. TH1 outputs $b_{k,2}$, $b_{k+1,2}$, $b_{k+2,2}$ . . . five clocks after TH6. Thus, it takes one clock from the holding of analog data until the MSB is generated. Thereafter, it takes (number of bits)× (clocks) until the total bits are generated. However, since each thresholding circuit (TH1 to TH6) starts the thresholding as soon as the thresholding of the previous analog data is completed, an apparent average calculation speed is one analog data per one clock, and the calculation time is one sixth of that of the first embodiment. If the process speed of the present embodiment is equivalent to that in the first embodiment, the clock speed is one sixth of that in the first embodiment, reducing a lot of electrical power consumption.

Figure 15:
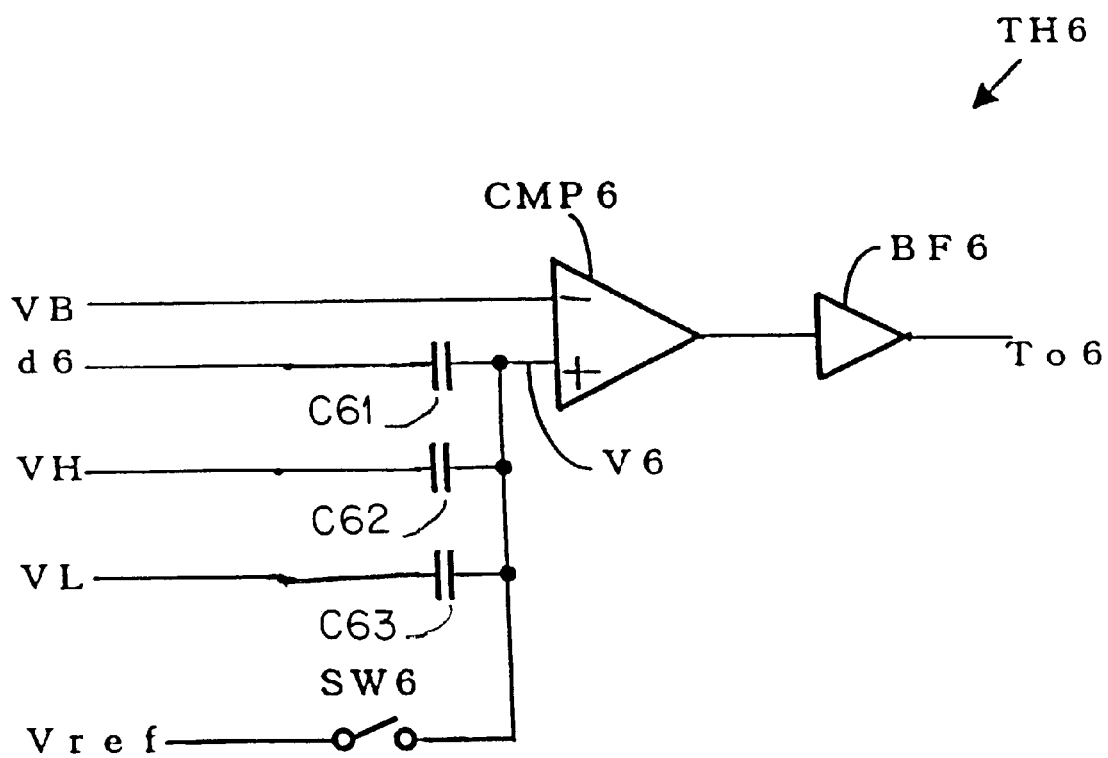
FIG. 15 is a circuit diagram showing a thresholding circuit of MSB in the forth embodiment of A/D converter.

FIG. 15 is a circuit diagram showing the thresholding circuit TH6 of the MSB in the forth embodiment. The thresholding circuit TH6 includes a comparison circuit CMP6 having a subtraction terminal and an addition terminal to which d6, a high reference voltage VH and a low reference voltage VL are input through capacitances C61, C62 and C63, respectively. As a result, a voltage V6 of the formula (37) is input to the addition terminal.

$$V6 = \frac{C61 \cdot d6 + C62 \cdot VH + C63 \cdot VL}{C61 + C62 + C63} \tag{37}$$

A threshold voltage VB is input to the subtraction terminal of the comparison circuit CMP6 such that the comparison circuit CMP6 outputs a high level when V6 is not less than VB. When V6 is less than VB, CMP6 outputs a predetermined low voltage. A buffer BF6 is connected to an output of the CMP6 for stabilizing an output To6 of the CMP6. A refresh voltage Vref is connected through a refresh switch SW6 to the addition terminal for refreshing the capacitances C61 to C63. When refreshed, inputs of the capacitances C61 to C63 are connected to Vref instead of d6, VH and VL.

Figure 16:
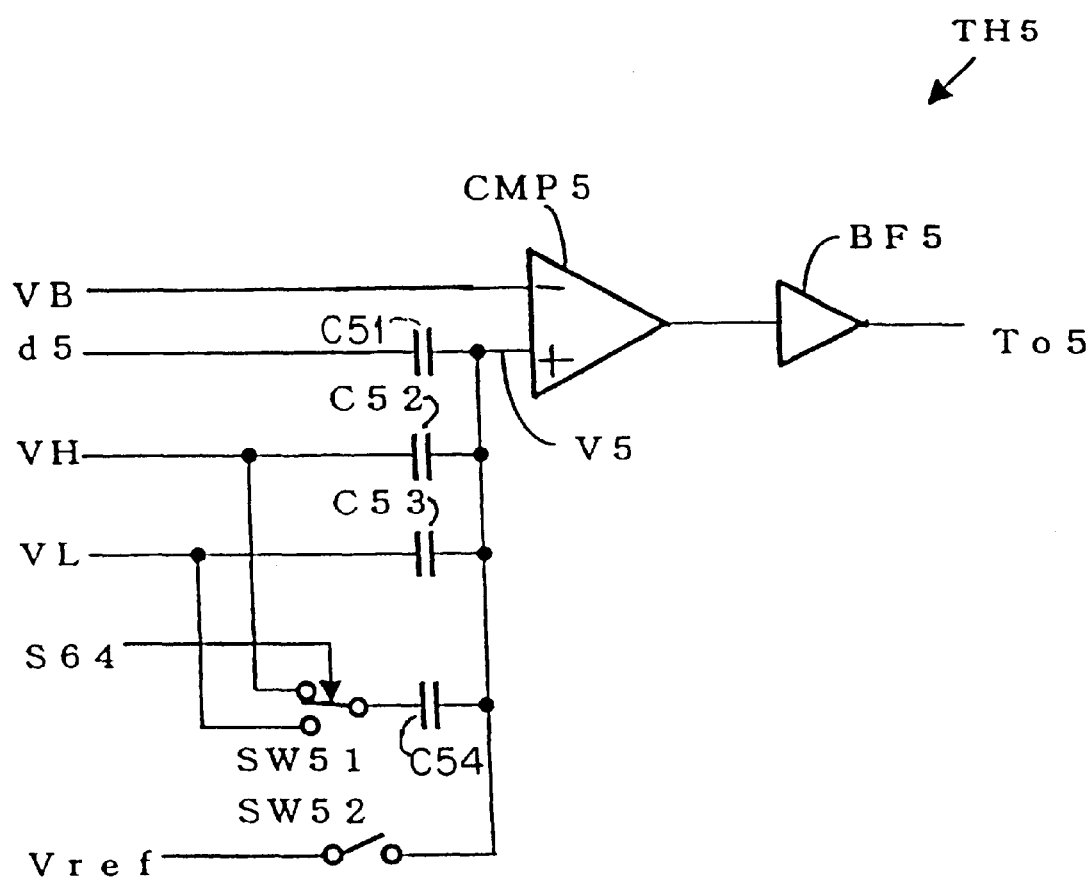
FIG. 16 is a circuit diagram showing a thresholding circuit of a second bit from the MSB in the forth embodiment of A/D converter.

FIG. 16 is a circuit diagram showing a thresholding circuit TH5 of a second bit from the MSB in the forth embodiment. The thresholding circuit TH5 includes a comparison circuit CMP5 having a subtraction terminal and an addition terminal to which d5, a high reference voltage VH and a low reference voltage VL are input through capacitances C51, C52 and C53, respectively. A switch SW51 is connected through a capacitance C54 to the addition terminal. The switch SW51 is controlled by an output S64 of the first flip-flop FF61, and outputs VL when S64 is high level and VH when S64 is low level. As a result, a voltage V5 of the formula (38) is input to the addition terminal. Here, a voltage connected to the switch SW51 is V(51).

$$V5 = \frac{C51 \cdot d5 + C52 \cdot VH + C53 \cdot VL + C54 \cdot V(51)}{C51 + C52 + C53 + C54} \quad (38)$$

A threshold voltage VB is input to the subtraction terminal of the comparison circuit CMP5 such that the comparison circuit CMP5 outputs a high level when V5 is not less than VB. When V5 is less than VB, CMP5 outputs a predetermined low voltage. A buffer BF5 is connected to an output of the CMP5 for stabilizing an output To5 of the CMP5. A refresh voltage Vref is connected through a refresh switch SW52 to the addition terminal for refreshing the capacitances C51 to C54. When refreshed, inputs of the capacitances C51 to C53 are connected to Vref instead of d5, VH and VL.

Figure 17:
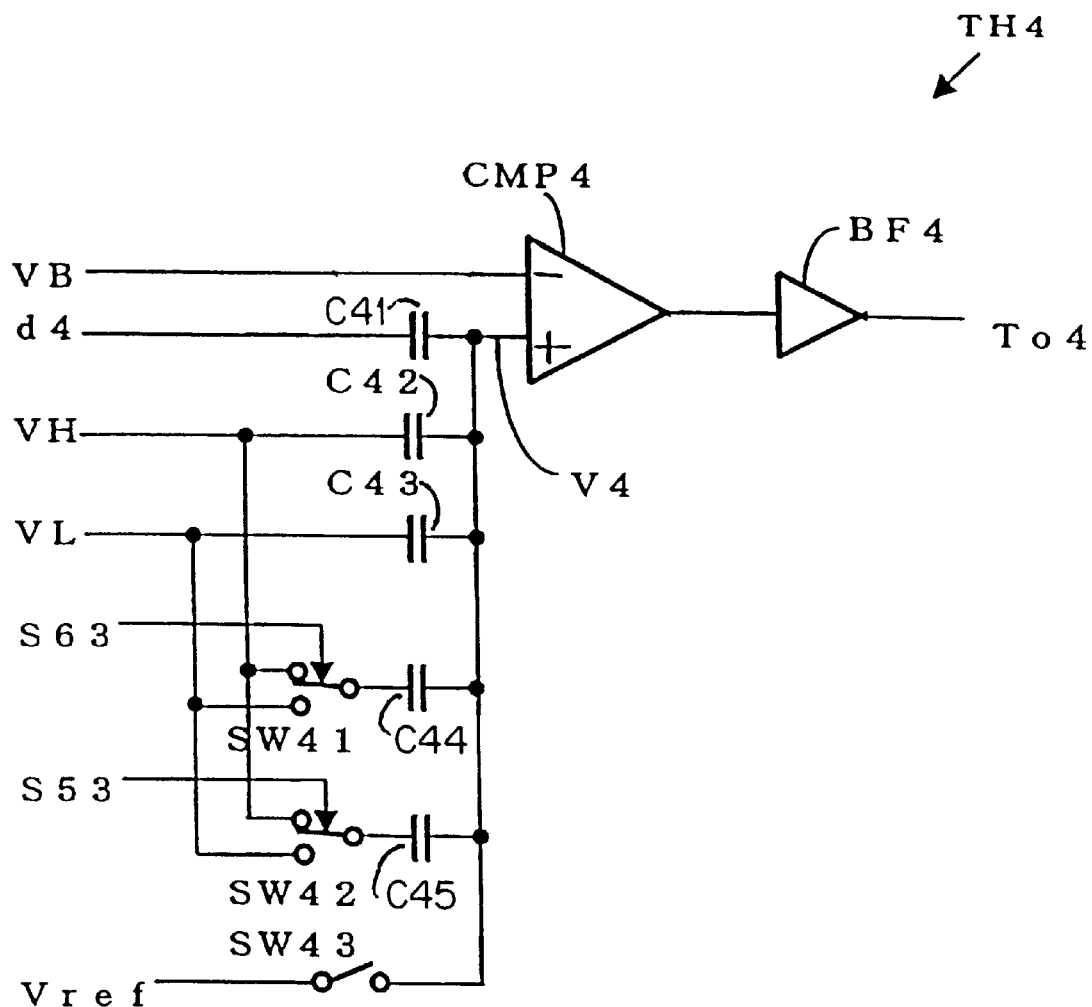
FIG. 17 is a circuit diagram showing a thresholding circuit of a third bit from the MSB in the forth embodiment of A/D converter.

FIG. 17 is a circuit diagram showing a thresholding circuit TH4 of a third bit from the MSB in the forth embodiment. The thresholding circuit TH4 includes a comparison circuit CMP4 having a subtraction terminal and an addition terminal to which d4, a high reference voltage VH and a low reference voltage VL are input through capacitances C41, C42 and C43, respectively. A switch SW41 is connected through a capacitance C44 to the addition terminal, and a switch SW42 is connected through a capacitance C45 to the addition terminal. The switch SW41 is controlled by an output S63 of the second flip-flop FF62 off the MSB, and outputs VL when S63 is high level and VH when S63 is low level. The switch SW42 is controlled by the output S53, and outputs VL when S53 is high level and VH when S53 is low level. As a result, a voltage V4 of the formula (39) is input to the addition terminal. Here, voltages connected to the switches SW41 and SW42 are V(21) and V(32).

$$V4 = \frac{C41 \cdot d4 + C42 \cdot VH + C43 \cdot VL + C44 \cdot V(41) + C45 \cdot V(42)}{C41 + C42 + C43 + C44 + C45} \quad (39)$$

A threshold voltage VB is input to the subtraction terminal of the comparison circuit CMP4 such that the comparison circuit CMP4 outputs a high level when V4 is not less than VB. When V4 is less than VB, CMP4 outputs a predetermined low voltage. A buffer BF4 is connected to an output of the CMP4 for stabilizing an output To4 of the CMP4. A refresh voltage Vref is connected through a refresh switch SW43 to the addition terminal for refreshing the capacitances C41 to C45. When refreshed, inputs of the capacitances C41 to C43 are connected to Vref instead of d4, VH and VL.

Figure 18:
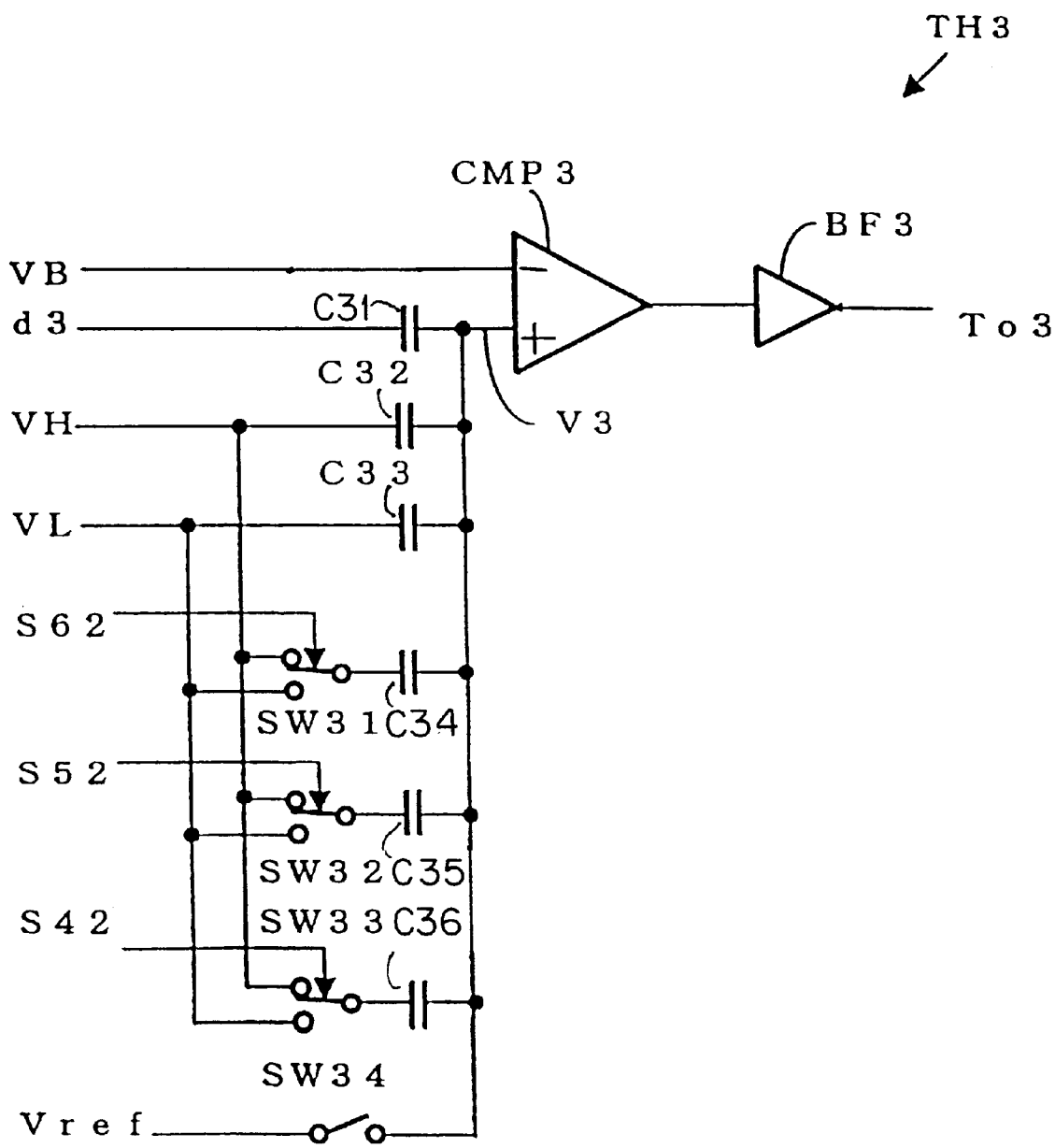
FIG. 18 is a circuit diagram showing a thresholding circuit of a fourth bit from the MSB in the forth embodiment of A/D converter.

FIG. 18 is a circuit diagram showing a thresholding circuit TH3 of a fourth bit from the MSB in the forth embodiment. The thresholding circuit TH3 includes a comparison circuit CMP3 having a subtraction terminal and an addition terminal to which d3, a high reference voltage VH and a low reference voltage VL are input through capacitances C31, C32 and C33, respectively. A switch SW31 is connected through a capacitance C34 to the addition terminal, a switch SW32 is connected through a capacitance C35 to the addition terminal, and a switch SW33 is connected through a capacitance C36 to the addition terminal. The switch SW31 is controlled by an output S62 of the third flip-flop FF63 off the MSB, and outputs VL when S62 is high level and VH when S62 is low level. The switch SW32 is controlled by the output S52 of the second flip-flop FF52 of the second bit, and outputs VL when S52 is high level and VH when S52 is low level. The switch SW33 is controlled by the output S42 of the first flip-flop FF41 of the third bit, and outputs VL when S42 is high level and VH when S42 is low level. As a result, a voltage V3 of the formula (40) is input to the addition terminal. Here, voltages connected to the switches SW31, SW32 and SW33 are V(31), V(32) and V(33).

$$V3 = \frac{C31 \cdot d3 + C32 \cdot VH + C33 \cdot VL + C34 \cdot V(31)}{C31 + C32 + C33 + C34 + C35 + C36} + \frac{C35 \cdot V(32) + C36 \cdot V(33)}{C31 + C32 + C33 + C34 + C35 + C36} \quad (40)$$

A threshold voltage VB is input to the subtraction terminal of the comparison circuit CMP3 such that the comparison circuit CMP3 outputs a high level when V3 is not less than VB. When V3 is less than VB, CMP3 outputs a predetermined low voltage. A buffer BF3 is connected to an output of the CMP3 for stabilizing an output To3 of the CMP3. A refresh voltage Vref is connected through a refresh switch SW35 to the addition terminal for refreshing the capacitances C31 to C36. When refreshed, inputs of the capacitances C31 to C33 are connected to Vref instead of d3, VH and VL.

Figure 19:
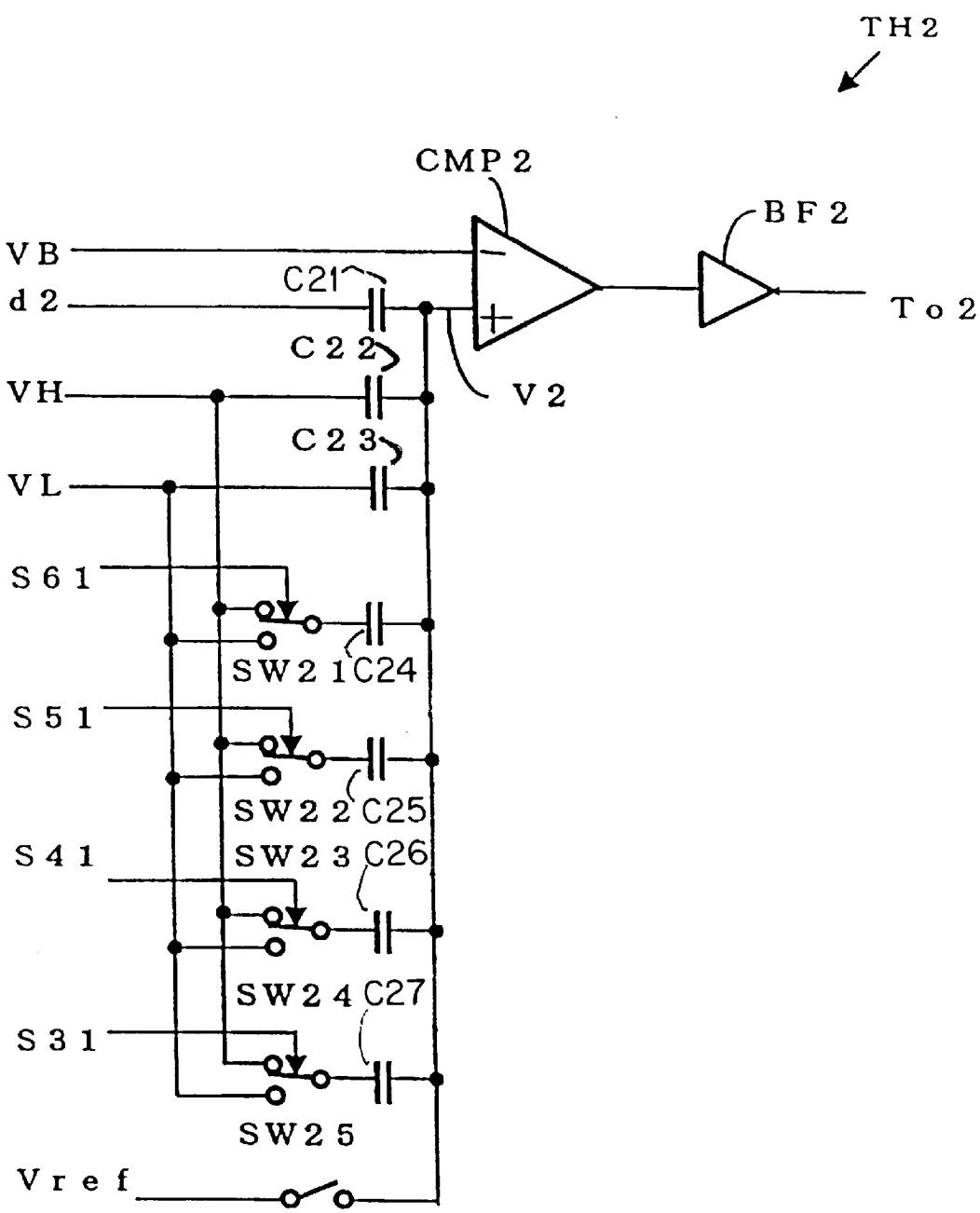
FIG. 19 is a circuit diagram showing a thresholding circuit of a fifth bit from the MSB in the forth embodiment of A/D converter.

FIG. 19 is a circuit diagram showing a thresholding circuit TH2 of a fifth bit from the MSB in the forth embodiment. The thresholding circuit TH2 includes a comparison circuit CMP2 having a subtraction terminal and an addition terminal to which d2, a high reference voltage VH and a low reference voltage VL are input through capacitances C21, C22 and C23, respectively. A switch SW21 is connected through a capacitance C24 to the addition terminal, a switch SW22 is connected through a capacitance C25 to the addition terminal, a switch SW23 is connected through a capacitance C26 to the addition terminal, and a switch SW24 is connected through a capacitance C27 to the addition terminal. The switch SW21 is controlled by an output S61 of the fourth flip-flop FF64 off the MSB, and outputs VL when S61 is high level and VH when S61 is low level. The switch SW22 is controlled by an output S51 of the third flip-flop FF53 of the second bit, and outputs VL when S51 is high level and VH when SS1 is low level. The switch SW23 is controlled by an output S42 of the second flip-flop FF42 of the third bit, and outputs VL when S42 is high level and VH when S42 is low level. The switch SW24 is controlled by an output S31 of the first flip-flop FF31 of the fourth bit, and outputs VL when S31 is high level and VH when S31 is low level. As a result, a voltage V2 of the formula (41) is input to the addition terminal. Here, voltages connected to the switches SW21, SW22, SW23 and SW24 are V(21), V(22), V(23) and V(24).

$$V2 = \frac{C21 \cdot d2 + C22 \cdot VH + C23 \cdot VL + C24 \cdot V(21)}{C21 + C22 + C23 + C24 + C25 + C26 + C27} + \tag{41}$$

$$\frac{C25 \cdot V(22) + C26 \cdot V(23) + C27 \cdot V(24)}{C21 + C22 + C23 + C24 + C25 + C26 + C27}$$

A threshold voltage VB is input to the subtraction terminal of the comparison circuit CMP2 such that the comparison circuit CMP2 outputs a high level when V2 is not less than VB. When V2 is less than VB, CMP2 outputs a predetermined low voltage. A buffer BF2 is connected to an output of the CMP2 for stabilizing an output To2 of the CMP2. A refresh voltage Vref is connected through a refresh switch SW25 to the addition terminal for refreshing the capacitances C21 to C27. When refreshed, inputs of the capacitances C21 to C23 are connected to Vref instead of d2, VH and VL.

Figure 20:
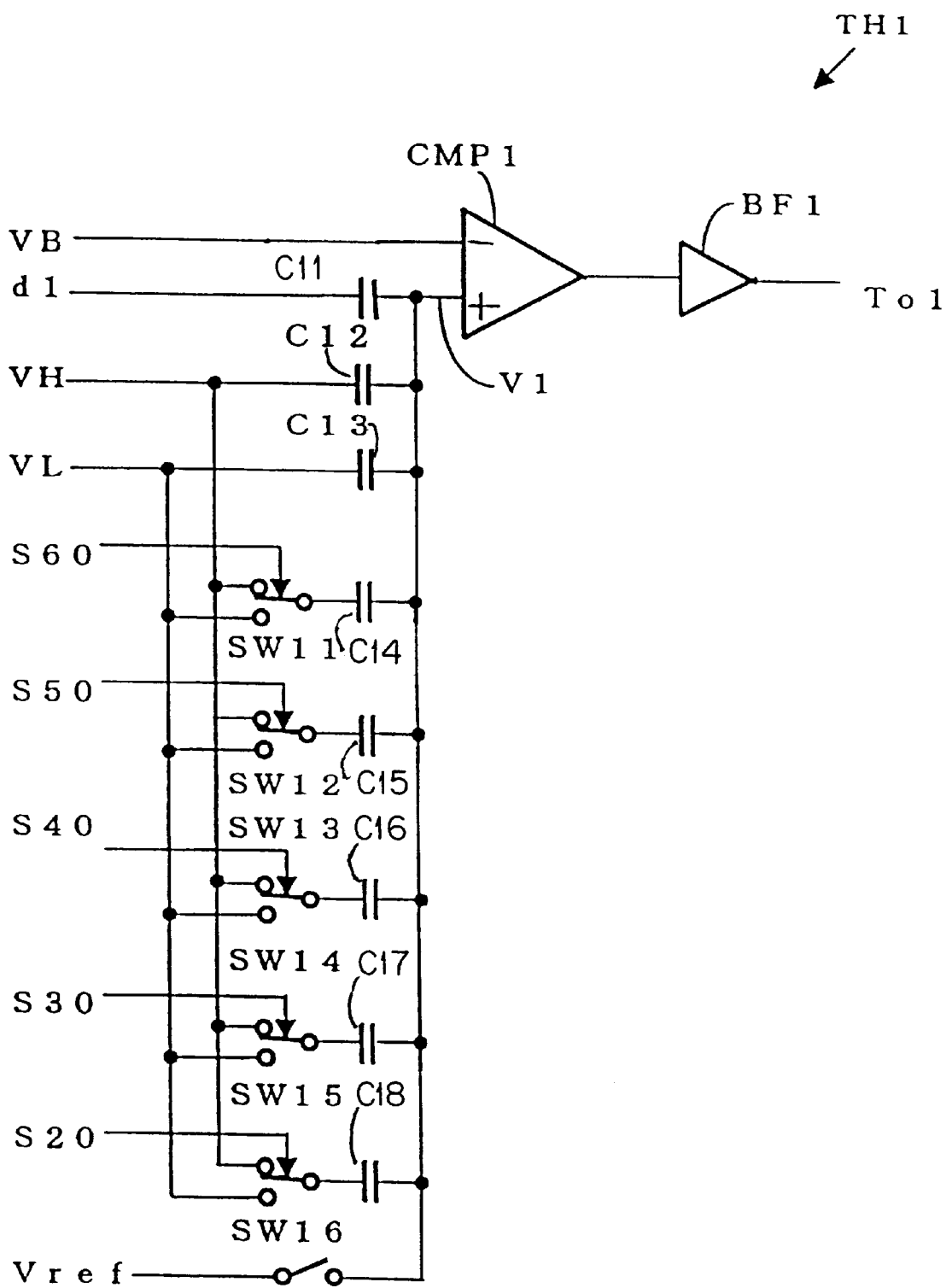
FIG. 20 is a circuit diagram showing a thresholding circuit of LSB in the forth embodiment of A/D converter.

FIG. 20 is a circuit diagram showing a thresholding circuit TH1 of the LSB in the forth embodiment. The thresholding circuit TH1 includes a comparison circuit CMP1 having a subtraction terminal and an addition terminal to which d1, a high reference voltage VH and a low reference voltage VL are input through capacitances C11, C12 and C13, respectively. A switch SW11 is connected through a capacitance C14 to the addition terminal, a switch SW12 is connected through a capacitance C15 to the addition terminal, a switch SW13 is connected through a capacitance C16 to the addition terminal, a switch SW14 is connected through a capacitance C17 to the addition terminal, and a switch SW15 is connected through a capacitance C18 to the addition terminal. The switch SW11 is controlled by an output S60 of the fifth flip-flop FF65 off the MSB, and outputs VL when S60 is high level and VH when S60 is low level. The switch SW12 is controlled by an output S50 of the fourth flip-flop FF54 of the second bit, and outputs VL when S50 is high level and VH when S50 is low level. The switch SW13 is controlled by an output S40 of the third flip-flop FF43 of the third bit, and outputs VL when S40 is high level and VH when S40 is low level. The switch SW14 is controlled by an output S30 of the second flip-flop FF32 of the fourth bit, and outputs VL when S30 is high level and VH when S30 is low level. As a result, a voltage VI of the formula (42) is input to the addition terminal. Here, voltages connected to the switches SW11, SW12, SW13, SW14 and SW15 are V(11), V(12), V(13), V(14) and V(25).

$$V1 = \frac{C11 \cdot d1 + C12 \cdot VH + C13 \cdot VL + C14 \cdot V(11) + C15 \cdot V(12)}{C11 + C12 + C13 + C14 + C15 + C16 + C17 + C18} + \tag{42}$$

$$\frac{C15 \cdot V(13) + C16 \cdot V(14) + C17 \cdot V(15) + C18 \cdot V(16)}{C11 + C12 + C13 + C14 + C15 + C16 + C17 + C18}$$

A threshold voltage VB is input to the subtraction terminal of the comparison circuit CMP1 such that the comparison circuit CMP1 outputs a high level when V1 is not less than VB. When V1 is less than VB, CMP1 outputs a predetermined low voltage. A buffer BF1 is connected to an output of the CMP1 for stabilizing an output To1 of the CMP1. A refresh voltage Vref is connected through a refresh switch SW16 to the addition terminal for refreshing the capacitances C11 to C18. When refreshed, inputs of the capacitances C11 to C13 are connected to Vref instead of d1, VH and VL.

The capacitances in FIGS. 15 to 20 have capacities in the following Table 1.

TABLE 1

| Capacitances | Capacity of Capacitances Capacity Ratio |
|---|---|
| C11:C12:C13:C14:C15:C16:C17:C18 | 64:1:1:32:16:8:4:2 |
| C21:C22:C23:C24:C25:C26:C27 | 32:1:1:16:8:4:2 |
| C31:C32:C33:C34:C35:C36 | 16:1:1:8:4:2 |
| C41:C42:C43:C44:C45 | 8:1:1:4:2 |
| C51:C52:C53:C54 | 4:1:1:2 |
| C61:C62:C63 | 2:1:1 |

Generally, VB=(VH+VL)/2 for maximizing the dynamic range, the MSB is high level when the formula (43) is true.

$$d6 \geq VB \tag{43}$$

As for the second bit, the output is high level in the condition that S64 is high level as well as the formula (44) is true.

$$d5 \geq 3/2VB - 1/2VL \tag{44}$$

or S64 is low level as well as the formula (45) is true.

$$d5 \geq 3/2VB - 1/2VL \tag{45}$$

What is claimed is:
1. An analog to digital converter comprising:
a differential input portion that receives an input voltage and a reference voltage and has a first and second output terminals, said differential input portion including first, second and third PMOSFETs, one gate of each said first and second PMOSFETs receiving said input voltage, the other gate receiving said reference voltage, outputs of said first and second PMOSFETs being connected to each other and through said third PMOSFET to a supply voltage, a gate of said third PMOSFET receiving a bias voltage;
a positive feedback portion connected to said first and second output terminals, said positive feedback portion including a first and second NMOSFETs an output terminal of said first NMOSFET being connected to said first output terminal and to a gate of said second NMOSFET, an output of said second NMOSFET being connected to said second output terminal and a gate of said second NMOSFET, outputs of said first and second NMOSFETs being connected to said supply voltage;
a first buffer of CMOSFETs connected at its input to said first output terminal;
a second buffer connected at its input to said second output terminal; and
a comparison circuit including a first switching portion connected between said first and second output terminals for connecting and disconnecting said first and second output terminals in response to a comparison clock signal, said comparison circuit being connected at its output to said first or second buffer, said first switching portion is NMOSFET or PMOSFET,
wherein said input voltage and said reference voltage are compared when said first switching portion changes from said connecting condition to said disconnecting condition in response to said comparison clock signal.
2. An analog to digital converter of claim 1, further comprising:
a second switching portion of a NMOSFET or PMOSFET connected between said first output terminals of said differential input portion and said supply voltage, said second switching portion being disconnected corresponding to said connecting or disconnecting of said first switching portion in response to said comparison clock signal; and a third switching portion of a NMOSFET or PMOSFET connected between said second output terminals of said differential input portion and said supply voltage, said third switching portion being disconnected corresponding to said connecting or disconnecting of said first switching portion in response to said comparison clock signal.

3. An analog to digital converter for converting an analog input voltage into a digital data of (m+1) bits (m: positive integer), comprising (m+1) number of comparison circuits of claims 1 or 2, corresponding to said bits of said digital data, wherein, said comparison clock signal for said comparison circuits is successively delayed from MSB (most significant bit) to LSB (least significant bit), each said comparison circuit compares an output of said corresponding threshold setting circuit with said reference voltage at a timing in response to said corresponding comparison clock signal and outputting an output as a comparison result, each said threshold setting circuit comprises a capacitive coupling having a plurality of capacitances receiving at input sides a first voltage corresponding to a lower limit of said analog input voltage, a second voltage corresponding to an upper limit of said analog input voltage and one or more of said first or second voltage output from said threshold setting circuits of upper bits than said threshold setting circuit, said capacitances being connected at output sides with one another for adding said voltages at said input sides, and said capacitive coupling of a jth said threshold setting circuit corresponds to the jth (j is 0 or positive integer) bit from the LSB (least significant bit) and weights said first and said second voltages input to said capacitive coupling by a weight of $2^j$, and said first and second voltages output from a kth threshold setting circuit from a lowest threshold setting circuit higher than said jth threshold setting circuit by a weight of $2^k$, said analog input voltage by a weight of $2^{m+1}$.

4. An analog to digital converter of sequential comparison type for converting an analog input voltage into a digital data of (m+1) bits (m: positive integer), comprising, a threshold setting circuit having a capacitive coupling;

a comparison circuit of claims 1 or 2 that compares an output of said threshold setting circuit with said reference voltage at a comparison timing of said comparing clock signal; and a control portion receiving an output of said comparison circuit at an input timing of a sequential control clock signal delayed from said comparison timing by a predetermined time that comprises a (m+1) stages serial output register for storing and outputting (m+1) bits digital data, and sequentially controlling an approximation of said digital data that corresponds to said analog input voltage;

wherein said capacitive coupling comprises a plurality of capacitances corresponding to said analog input voltage and said stages of said output register for receiving at input sides said analog input voltage and said (m+1) bits digital data, said capacitances are connected at output sides with one another for adding said voltages at said input sides, and said capacitances have capacities corresponding to weights of said analog input voltage and said bits.

5. A timing setting method for comparing an analog input signal with a reference voltage by an analog to digital converting circuit having one or more comparison circuits at a timing defined by a comparison clock signal, wherein a plurality of timing signals including at least one or more of said comparison clock signals is generated, said plurality of timing signals and a predetermined test voltage are supplied to said analog to digital circuit, an error of an output of said analog to digital converter is detected during gradually decreasing a distance between said timing signals, and said distance is determined to be a value just before said error is detected.

6. An analog to digital converter comprising a timing setting portion and an analog to digital converting portion that includes one or more comparison circuits for comparing an analog input voltage with a reference voltage at a timing defined by a comparison clock signal, said timing setting portion comprising:

a voltage supply for supplying a test voltage to said analog to digital converting portion;

a timing signal generator for generating a plurality of timing signals including at least one or more of said comparison clock signals and outputting said timing signals to said analog to digital converting portion;

an error detector for detecting an output error of said analog to digital converting portion; and a controller for holding and setting a distance between said plurality of timing signals such that said distance is just before said output error is detected during a decreasing of said distance by supplying said test voltage to said analog to digital converting portion from said voltage supply.

7. Analog to digital converter of claim 6, wherein said test voltage is a constant voltage, and said error detector detects said error from a change of said output of said analog to digital converting portion.

8. An analog to digital converter of sequential comparison type for sequentially outputting a digital signal output corresponding to an analog input voltage, comprising:

a plurality of sampling and holding circuits of a number more by one than a number of bits of said digital signal for holding said analog input voltage;

a plurality of multiplexers corresponding to said bits of said digital signal, each of said multiplexers successively outputs one of said sampling and holding circuits;

a plurality of thresholding circuits corresponding to said bits of said digital signal and said thresholding circuits, each said thresholding circuit receives the outputs of said corresponding multiplexers having thresholds corresponding to weights of said bits of said digital signal; and a plurality of holding circuits corresponding to said thresholding circuits, one of said holding circuits corresponds to a LSB (least significant bit) of said digital signal having one stage, the other said holding circuits having increasing stages by one from said LSB, wherein, an output of a first stage of said holding circuits is input to said thresholding circuit of adjacent lower bit, outputs of following stages are input to said thresholding circuits of lower bits, and each one of the other said thresholding circuits of second or lower bits comprises:
- a switch for outputting a high reference voltage or a low reference voltage in response to said outputs of said holding circuits;
- a plurality of capacitances that receives outputs of said switches and said multiplexers and are integrated at their outputs;
- a comparison circuit that compares said integrated output of said capacitances with a predetermined threshold,
- said thresholding circuit of MSB (most significant bit) comprises capacitance connected to said output of said multiplexers, and a comparison circuit that compares said integrated output of said capacitances with a predetermined threshold.

9. An analog to digital converter of sequential comparison type of claim 8, wherein a high reference voltage and a low reference voltage are input to said comparison circuit of each said threshold circuits.

10. An analog to digital converter of sequential comparison type of claim 9, wherein,
- each said thresholding circuit has a threshold of an average voltage of said high reference voltage and said low reference voltage,
- said capacitances of said thresholding circuit of said MSB are equal in capacities to each other,
- said capacitances connected to said multiplexer has a capacity twice the capacity of said capacitances connected to said high reference voltage and a low reference voltage,
- said capacitances connected to said high reference voltage and said low reference voltage of said thresholding circuit of said second bit are equal in capacities to each other,
- said capacitances connected to said output of said holding circuit of said MSB have a capacity twice the capacity of said capacitances connected to said high reference voltage and a low reference voltage,
- said capacitances connected to said multiplexer have a capacity twice the capacity of said capacitances connected to said holding circuit,
- said capacitances connected to said high reference voltage and said low reference voltage of each said lower thresholding circuits are equal in capacities to each other,
- said capacitances connected to said holding circuits increase in capacity, said increase is from $2^1$ to $2^k$ multiples of said capacitances connected to said high reference voltage and a low reference voltage, and
- said capacitances connected to said multiplexer have a capacity twice the 2kth capacity of said capacitances connected to said holding circuit.

11. An analog to digital converter of sequential comparison type of claim 8, wherein each said thresholding circuit comprising a refresh switch that connects a refresh voltage to said comparison circuit.

12. An analog to digital converter of sequential comparison type of claim 8, wherein said data in said stages of said holding circuit are shifted from a first stage to a last stage in response to a clock synchronized with a sampling clock for said holding circuit.

13. An analog to digital converter of sequential comparison type claim 8, wherein said outputs of said stages of said holding circuits of said thresholding circuits other than said LSB are input to each of said thresholding circuits of lower bits.

14. An analog to digital converter of sequential comparison type of claim 8, wherein said digital signal converted from said held analog input voltage is output from last stages of said holding circuits corresponding to said bits.

* * * * *